US011469116B2

(12) United States Patent
Hidaka et al.

(10) Patent No.: US 11,469,116 B2
(45) Date of Patent: Oct. 11, 2022

(54) SUBSTRATE PROCESSING APPARATUS AND SUBSTRATE PROCESSING METHOD

(71) Applicant: TOYKO ELECTRON LIMITED, Tokyo (JP)

(72) Inventors: Shoichiro Hidaka, Koshi (JP); Boui Ikeda, Koshi (JP); Eiichi Sekimoto, Koshi (JP); Kazuya Iwanaga, Koshi (JP); Masato Hayashi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/522,246

(22) Filed: Jul. 25, 2019

(65) Prior Publication Data

US 2020/0035517 A1 Jan. 30, 2020

(30) Foreign Application Priority Data

Jul. 25, 2018 (JP) .............................. JP2018-139747

(51) Int. Cl.
*H01L 21/67* (2006.01)
*B08B 3/10* (2006.01)
(Continued)

(52) U.S. Cl.
CPC ........ *H01L 21/67051* (2013.01); *B08B 3/041* (2013.01); *B08B 3/10* (2013.01);
(Continued)

(58) Field of Classification Search
CPC ......... H01L 21/67051; H01L 21/67115; H01L 21/0206; H01L 21/02057; H01L 21/68792;
(Continued)

(56) References Cited

U.S. PATENT DOCUMENTS 6,173,468 B1 * 1/2001 Yonemizu ......... H01L 21/67028
15/77
6,334,902 B1 * 1/2002 Mertens ............ H01L 21/67028
134/32

(Continued)

FOREIGN PATENT DOCUMENTS

JP 2014090015 A 5/2014
JP 2018-113354 A 7/2018
KR 1020180039199 A 4/2018

*Primary Examiner* — Duy Vu N Deo
*Assistant Examiner* — Christopher Remavege
(74) *Attorney, Agent, or Firm* — Nath, Goldberg & Meyer; Jerald L. Meyer; Tanya E. Harkins

(57) ABSTRACT

There is provided a substrate processing apparatus, including: a substrate holder configured to hold a substrate with a surface of the substrate on which a concavo-convex pattern is formed oriented upward; a liquid supply unit configured to supply a processing liquid to the substrate held by the substrate holder to form a liquid film at least in a concave portion of the concavo-convex pattern; a heating unit configured to irradiate the substrate held by the substrate holder or the liquid film with a laser beam for heating the liquid film; and a heating controller configured to control the heating unit, wherein the heating controller controls the heating unit to expose the entire concave portion in a depth direction from the processing liquid by irradiating the laser beam onto the substrate or the liquid film from the heating unit.

9 Claims, 17 Drawing Sheets

(51) Int. Cl.
 *B08B 3/04* (2006.01)
 *H01L 21/02* (2006.01)

(52) U.S. Cl.
 CPC .... *H01L 21/0206* (2013.01); *H01L 21/67115* (2013.01); *B08B 2203/007* (2013.01)

(58) Field of Classification Search
 CPC ......... H01L 21/67248; H01L 21/67028; H01L 21/67034; B08B 3/10; B08B 3/041; B08B 2203/007
 See application file for complete search history.

(56) References Cited

U.S. PATENT DOCUMENTS

| | | | |
|---|---|---|---|
| 9,790,597 B2 * | 10/2017 | Yamaga | H01L 21/68771 |
| 10,281,210 B2 * | 5/2019 | Miyazaki | H01L 21/67115 |
| 10,332,761 B2 * | 6/2019 | Kobayashi | H01L 21/67051 |
| 10,658,204 B2 * | 5/2020 | Hill | H01L 21/68728 |
| 2012/0080061 A1 * | 4/2012 | Kim | F26B 5/08 |
| | | | 134/95.2 |
| 2012/0160274 A1 * | 6/2012 | Kasai | H01L 21/67051 |
| | | | 134/26 |
| 2014/0331927 A1 * | 11/2014 | Nakano | H01L 21/68728 |
| | | | 118/620 |
| 2016/0071745 A1 * | 3/2016 | Kim | H01L 21/67028 |
| | | | 219/121.84 |
| 2018/0090342 A1 * | 3/2018 | Hinode | H01L 21/67051 |
| 2019/0051541 A1 * | 2/2019 | Hill | H01L 21/68728 |

* cited by examiner

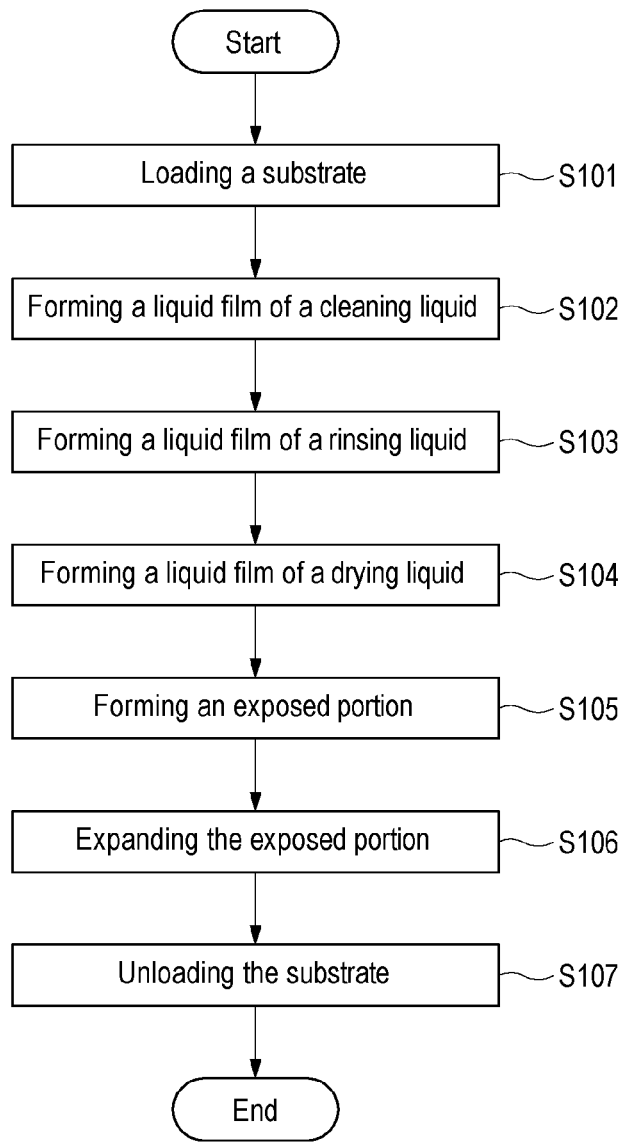

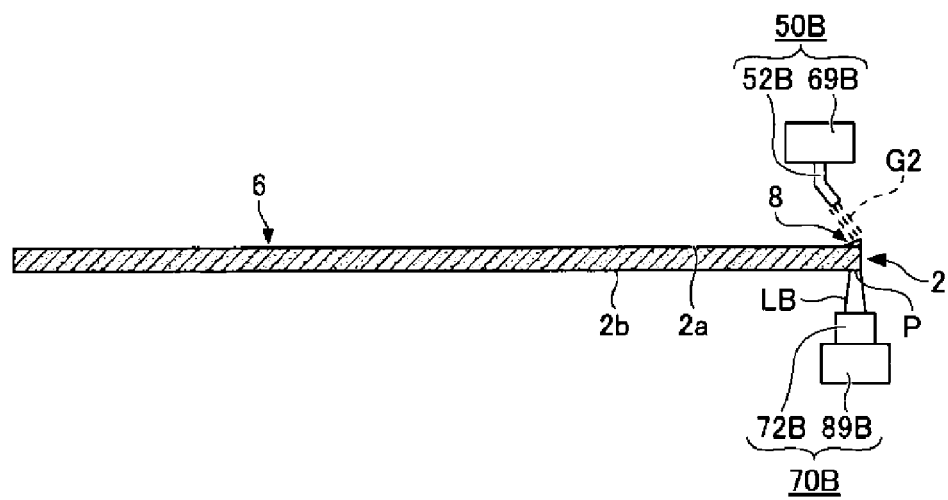

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2018-139747, filed on Jul. 25, 2018, the entire contents of which are incorporated herein by reference.

TECHNICAL FIELD

The present disclosure relates to a substrate processing apparatus and a substrate processing method.

BACKGROUND

A liquid processing system disclosed in Patent Document 1 includes a liquid processing apparatus that performs liquid processing by supplying a processing liquid to a substrate, and a control part that controls the liquid processing apparatus. The liquid processing apparatus includes a substrate holder for holding the substrate, a first supply part for supplying a volatile fluid to a front surface of the substrate held by the substrate holder, and a second supply part for supplying a heating fluid to a back surface of the substrate held by the substrate holder. For example, IPA (isopropyl alcohol) is used as the volatile fluid. The IPA is supplied to a pattern formation surface of the substrate. For example, heated pure water is used as the heating fluid. The control part causes the liquid processing apparatus to perform a volatile fluid supply process, an exposure process and a heating fluid supply process. The volatile fluid supply process is a process in which the volatile fluid is supplied to the front surface of the substrate from the first supply part to form a liquid film on the front surface of the substrate. The exposure process is a process in which the front surface of the substrate is exposed from the volatile fluid. The heating fluid supply process is a process which is started prior to the exposure process and in which the heating fluid is supplied from the second supply part to the back surface of the substrate during a period overlapping with the exposure process.

RELATED ART DOCUMENT

Patent Documents

Patent Document 1: Japanese Patent Laid-Open Publication No. 2014-90015

SUMMARY

Some embodiments of the present disclosure provide a technique capable of suppressing a pattern collapse of a concavo-convex pattern when drying a liquid film which covers the concavo-convex pattern.

According to one embodiment of the present disclosure, there is provided a substrate processing apparatus, including: a substrate holder configured to hold a substrate with a surface of the substrate on which a concavo-convex pattern is formed oriented upward; a liquid supply unit configured to supply a processing liquid to the substrate held by the substrate holder to form a liquid film at least in a concave portion of the concavo-convex pattern; a heating unit configured to irradiate the substrate held by the substrate holder or the liquid film with a laser beam for heating the liquid film; and a heating controller configured to control the heating unit, wherein the heating controller controls the heating unit to irradiate the laser beam onto the substrate or the liquid film to expose the entire concave portion in a depth direction from the processing liquid.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

FIG. 5 is a flowchart showing a substrate processing method according to the first embodiment.

FIGS. 14A to 14C are side views showing some steps of the substrate process according to the fourth embodiment.

DETAILED DESCRIPTION

Figure 1:
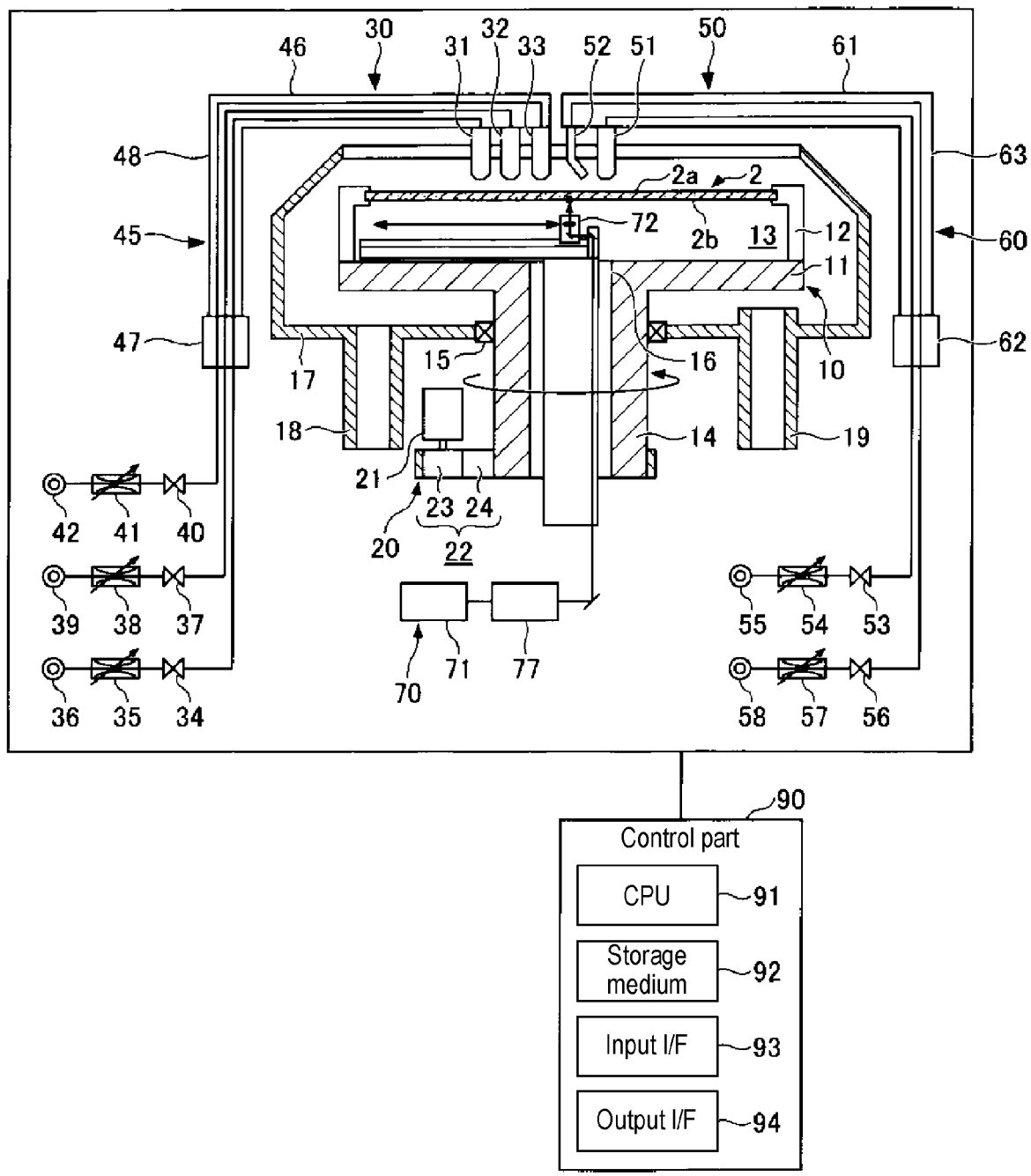
FIG. 1 is a view showing a substrate processing apparatus according to a first embodiment.

Hereinafter, the embodiments of the present disclosure will be described with reference to the figures. The same or corresponding components in the figures are denoted by the same or corresponding reference numerals, and the description thereof may be omitted. In the subject specification, the term "downward" refers to downward in the vertical direction, and the term "upward" refers to upward in the vertical direction.

Figure 2:
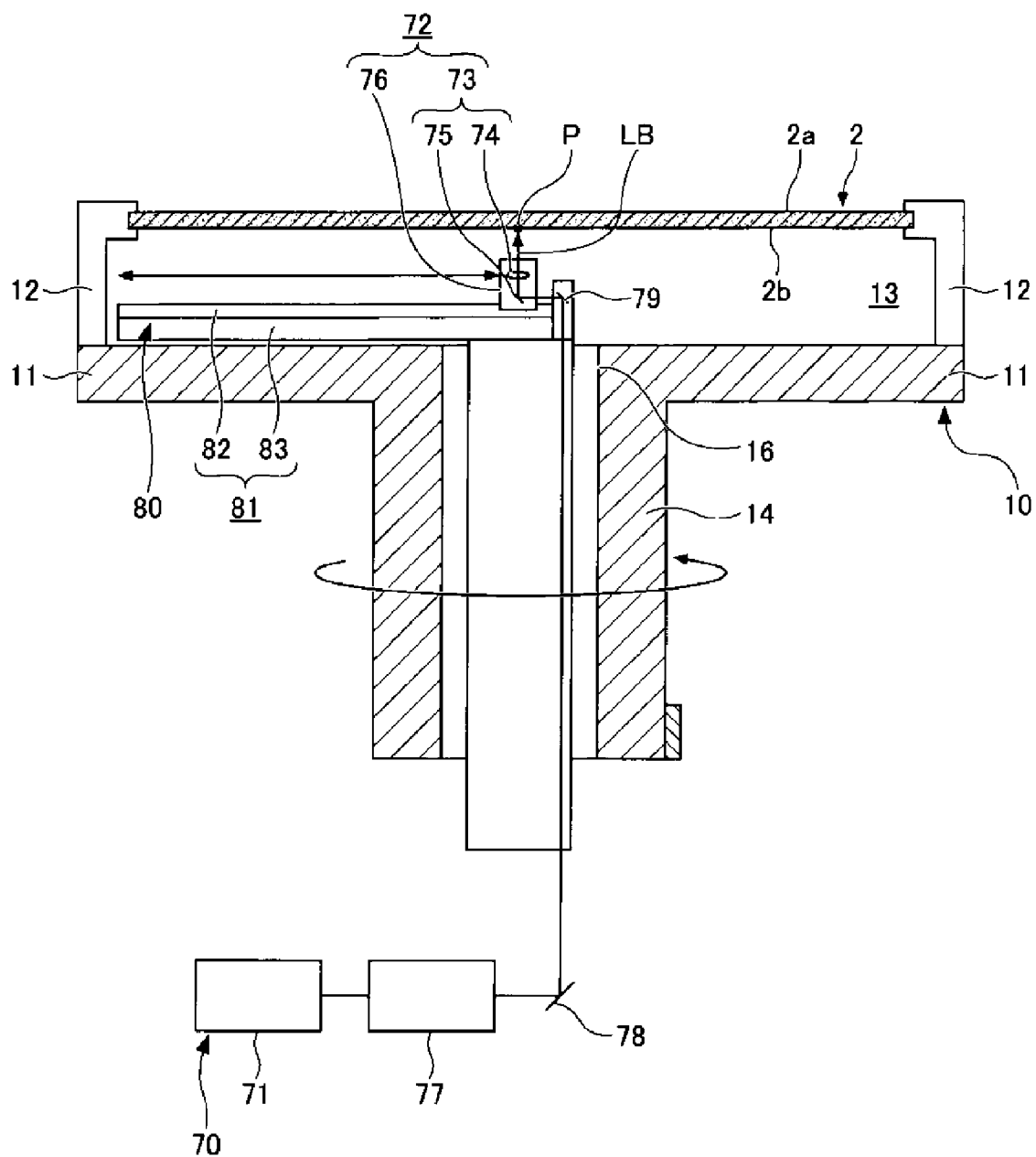
FIG. 2 is a view showing a substrate holder and a heating unit according to the first embodiment, in which a portion of FIG. 1 is scaled up.

FIG. 1 is a view showing a substrate processing apparatus according to a first embodiment. FIG. 2 is a view showing a substrate holder and a heating unit according to the first embodiment, in which a portion of FIG. 1 is scaled up. As shown in FIG. 1, the substrate processing apparatus 1 includes a substrate holder 10, a rotary driver 20, a liquid supply unit 30, a gas supply unit 50, a heating unit 70 and a control part 90.

The substrate holder 10 holds a substrate 2 in a horizontal posture in a state where a surface 2a of the substrate 2 on which a concavo-convex pattern 4 (see FIG. 8) is formed is oriented upward. The substrate 2 may be a semiconductor substrate such as a silicon wafer or the like. The concavo-convex pattern 4 may be formed by a photolithography method. An etching method may be used in addition to the photolithography method. The concavo-convex pattern 4 may be formed by etching a film (e.g., a silicon nitride film) formed on the substrate 2. The concavo-convex pattern 4 has a concave portion 5 opened upward.

The substrate holder 10 includes a disc-shaped plate portion 11 and claw portions 12 arranged on the outer periphery of the plate portion 11. The claw portions 12 are arranged at intervals in the circumferential direction. The claw portions 12 hold the outer peripheral edge of the substrate 2 so that the substrate 2 is held while floating from the plate portion 11. A gap space 13 is formed between the substrate 2 and the plate portion 11.

The substrate holder 10 includes a rotary shaft portion 14 extending downward from the center of the plate portion 11. The rotary shaft portion 14 is rotatably supported by a bearing 15. A through-hole 16 is formed at the center of the plate portion 11. The rotary shaft portion 14 is formed in a cylindrical shape. The internal space of the rotary shaft portion 14 is in communication with the gap space 13 via the through-hole 16.

The rotary driver 20 rotates the substrate holder 10. The rotary driver 20 rotates the substrate holder 10 about the rotary shaft portion 14 of the substrate holder 10. As the substrate holder 10 rotates, the substrate 2 held by the substrate holder 10 is rotated.

The rotary driver 20 includes a rotary motor 21 and a transmission mechanism 22 that transmits the rotational movement of the rotary motor 21 to the rotary shaft portion 14. The transmission mechanism 22 may include a pulley 23 and a timing belt 24. The pulley 23 is attached to the output shaft of the rotary motor 21 and rotates together with the output shaft of the rotary motor 21. The timing belt 24 is wound around the pulley 23 and the rotary shaft portion 14. The transmission mechanism 22 transmits the rotational movement of the rotary motor 21 to the rotary shaft portion 14. The transmission mechanism 22 may include a plurality of gears instead of the pulley 23 and the timing belt 24.

The liquid supply unit 30 supplies a processing liquid to the substrate 2 held by the substrate holder 10 from above. The liquid supply unit 30 may supply plural types of processing liquids, or may supply a processing liquid corresponding to a processing step of the substrate 2. Examples of the processing liquid supplied by the liquid supply unit 30 may include a cleaning liquid L1 (see FIG. 6A), a rinsing liquid L2 (see FIG. 6B) and a drying liquid L3 (see FIG. 6C). The cleaning liquid may also be referred to as a chemical liquid.

The liquid supply unit 30 includes liquid discharge nozzles for discharging processing liquids. The liquid supply unit 30 may include a cleaning liquid discharge nozzle 31, a rinsing liquid discharge nozzle 32 and a drying liquid discharge nozzle 33 as the liquid discharge nozzles. The cleaning liquid discharge nozzle 31 discharges a cleaning liquid L1, the rinsing liquid discharge nozzle 32 discharges a rinsing liquid L2, and the drying liquid discharge nozzle 33 discharges a drying liquid L3. In some embodiments, one liquid discharge nozzle may discharge plural types of processing liquids. In addition, the liquid discharge nozzles may discharge processing liquids mixed with gases.

The cleaning liquid discharge nozzle 31 is coupled to a supply source 36 via an opening/closing valve 34 and a flow rate adjustment valve 35. When the opening/closing valve 34 opens a flow path for the cleaning liquid L1, the cleaning liquid L1 is discharged from the cleaning liquid discharge nozzle 31. On the other hand, when the opening/closing valve 34 closes the flow path for the cleaning liquid L1, the discharge of the cleaning liquid L1 from the cleaning liquid discharge nozzle 31 is stopped. The flow rate adjustment valve 35 adjusts a flow rate of the cleaning liquid L1 discharged by the cleaning liquid discharge nozzle 31. The supply source 36 supplies the cleaning liquid L1 to the cleaning liquid discharge nozzle 31.

The cleaning liquid L1 is not particularly limited and may be DHF (dilute hydrofluoric acid). A temperature of the cleaning liquid L1 may be room temperature or may be higher than room temperature and lower than a boiling point of the cleaning liquid L1.

The cleaning liquid L1 may be any general liquid used for cleaning a semiconductor substrate and is not limited to DHF. For example, the cleaning liquid L1 may be SC-1 (an aqueous solution containing ammonium hydroxide and hydrogen peroxide) or SC-2 (an aqueous solution containing hydrogen chloride and hydrogen peroxide). Plural kinds of cleaning liquids L1 may be used.

The rinsing liquid discharge nozzle 32 is coupled to a supply source 39 via an opening/closing valve 37 and a flow rate adjustment valve 38. When the opening/closing valve 37 opens a flow path for the rinsing liquid L2, the rinsing liquid L2 is discharged from the rinsing liquid discharge nozzle 32. On the other hand, when the opening/closing valve 37 closes the flow path for the rinsing liquid L2, the discharge of the rinsing liquid L2 from the rinsing liquid discharge nozzle 32 is stopped. The flow rate adjustment valve 38 adjusts a flow rate of the rinsing liquid L2 discharged by the rinsing liquid discharge nozzle 32. The supply source 39 supplies the rinsing liquid L2 to the rinsing liquid discharge nozzle 32.

The rinsing liquid L2 is not particularly limited and may be DIW (deionized water). A temperature of the rinsing liquid L2 may be room temperature, or may be higher than room temperature and lower than a boiling point of the rinsing liquid L2. The higher the temperature of the rinsing liquid L2, the lower a surface tension of the rinsing liquid L2.

The drying liquid discharge nozzle 33 is coupled to a supply source 42 via an opening/closing valve 40 and a flow rate adjustment valve 41. When the opening/closing valve 40 opens a flow path for the drying liquid L3, the drying liquid L3 is discharged from the drying liquid discharge nozzle 33. On the other hand, when the opening/closing valve 40 closes the flow path for the drying liquid L3, the discharge of the drying liquid L3 from the drying liquid discharge nozzle 33 is stopped. The flow rate adjustment valve 41 adjusts a flow rate of the drying liquid L3 discharged by the drying liquid discharge nozzle 33. The supply source 42 supplies the drying liquid L3 to the drying liquid discharge nozzle 33.

The drying liquid L3 is not particularly limited and may be IPA (isopropyl alcohol). IPA has a lower surface tension than DIW. A temperature of the drying liquid L3 may be room temperature, or may be higher than room temperature and lower than a boiling point of the drying liquid L3. The higher the temperature of the drying liquid L3, the lower a surface tension of the drying liquid L3.

In addition, the drying liquid L3 may be any liquid having a lower surface tension than the rinsing liquid L2 and is not limited to IPA. For example, the drying liquid L3 may be HFE (hydrofluoroether), methanol, ethanol, acetone, or trans-1,2-dichloroethylene.

The liquid supply unit 30 supplies the processing liquid such as the cleaning liquid L1, the rinsing liquid L2, the drying liquid L3 or the like onto, for example, the central portion of the substrate 2 which is rotating together with the substrate holder 10. The processing liquid supplied onto the central portion of the rotating substrate 2 soaks and spreads over the entire upper surface 2a of the substrate 2 by virtue of a centrifugal force. The processing liquid is dropped from the outer peripheral edge of the substrate 2. The droplets of the dropped processing liquid are collected in a cup 17.

The cup 17 holds the bearing 15 that rotatably supports the substrate holder 10. The cup 17 does not rotate with the substrate holder 10. A drainage pipe 18 and an exhaust pipe 19 are provided in the bottom of the cup 17. The drainage pipe 18 drains the liquid in the cup 17, and the exhaust pipe 19 discharges the gas in the cup 17.

The liquid supply unit 30 includes a liquid discharge nozzle moving mechanism 45. The liquid discharge nozzle moving mechanism 45 moves the cleaning liquid discharge nozzle 31, the rinsing liquid discharge nozzle 32 and the drying liquid discharge nozzle 33 in the horizontal direction. The liquid discharge nozzle moving mechanism 45 moves the cleaning liquid discharge nozzle 31, the rinsing liquid discharge nozzle 32 and the drying liquid discharge nozzle 33 between a position immediately above the central portion of the substrate 2 and a position immediately above the outer peripheral portion of the substrate 2. The cleaning liquid discharge nozzle 31, the rinsing liquid discharge nozzle 32 and the drying liquid discharge nozzle 33 may be further moved to a standby position existing more radially outward of the substrate 2 than the outer peripheral portion of the substrate 2.

For example, the liquid discharge nozzle moving mechanism 45 includes a swing arm 46 and a swing mechanism 47 for swinging the swing arm 46. The swing arm 46 is disposed in a horizontal posture. The cleaning liquid discharge nozzle 31, the rinsing liquid discharge nozzle 32 and the drying liquid discharge nozzle 33 are held at the distal end of the swing arm 46 with discharge ports 31a, 32a and 33a (see FIG. 6) thereof oriented downward. The swing mechanism 47 swings the swing arm 46 about a swing shaft 48 extending downward from the proximal end of the swing arm 46. The liquid discharge nozzle moving mechanism 45 horizontally moves the cleaning liquid discharge nozzle 31, the rinsing liquid discharge nozzle 32 and the drying liquid discharge nozzle 33 by swinging the swing arm 46.

The liquid discharge nozzle moving mechanism 45 may include a guide rail and a linear motion mechanism instead of the swing arm 46 and the swing mechanism 47. The guide rail is disposed in a horizontal posture. The linear motion mechanism moves the cleaning liquid discharge nozzle 31, the rinsing liquid discharge nozzle 32 and the drying liquid discharge nozzle 33 along the guide rail. Furthermore, in the present embodiment, the liquid discharge nozzle moving mechanism 45 simultaneously moves the cleaning liquid discharge nozzle 31, the rinsing liquid discharge nozzle 32 and the drying liquid discharge nozzle 33 in the same direction at the same speed. However, the cleaning liquid discharge nozzle 31, the rinsing liquid discharge nozzle 32 and the drying liquid discharge nozzle 33 may be moved separately.

The gas supply unit 50 supplies a gas from above onto the substrate 2 held by the substrate holder 10. The gas supplied onto the substrate 2 presses the liquid film formed on the substrate 2, thereby pressing a boundary portion 8 between an exposed portion 6 and a covered portion 7 shown in FIG. 8.

The exposed portion 6 is a portion in which the entire concave portion 5 in the concavo-convex pattern 4 is exposed from the drying liquid L3 in the depth direction. Since the drying liquid L3 does not exist in the exposed portion 6, the surface tension of the drying liquid L3 does not act on the exposed portion 6.

The covered portion 7 is a portion in which the entire concave portion 5 in the concavo-convex pattern 4 is filled with the drying liquid L3 in the depth direction. In the covered portion 7, the height of a liquid surface LS3 of the drying liquid L3 is higher than that of an upper end 5a of the concave portion 5. Therefore, the surface tension of the drying liquid L3 does not act on the covered portion 7.

The boundary portion 8 is a portion in which only a portion of the concave portion 5 in the concavo-convex pattern 4 makes contact with the drying liquid L3 in the depth direction. In the boundary portion 8, the height of the liquid surface LS3 of the drying liquid L3 is lower than that of the upper end 5a of the concave portion 5 and higher than that of a lower end 5b of the concave portion 5. In the boundary portion 8, the sidewall surface of the concave portion 5 makes contact with the liquid surface LS3. Thus, the surface tension of the drying liquid L3 acts on the boundary portion 8.

The gas supply unit 50 includes gas discharge nozzles for discharging gases. The gas supply unit 50 includes, for example, a vertical nozzle 51 and an inclined nozzle 52 as the gas discharge nozzles. The vertical nozzle 51 discharges a gas G1 (see FIG. 6) in the vertical direction. The inclined nozzle 52 discharges a gas G2 (see FIG. 7) obliquely with respect to the vertical direction.

The vertical nozzle 51 is coupled to a supply source 55 via an opening/closing valve 53 and a flow rate adjustment valve 54. When the opening/closing valve 53 opens a flow path for the gas G1, the gas G1 is discharged from the vertical nozzle 51. On the other hand, when the opening/closing valve 53 closes the flow path for the gas G1, the discharge of the gas G1 from the vertical nozzle 51 is stopped. The flow rate adjustment valve 54 adjusts a flow rate of the gas G1 discharged by the vertical nozzle 51. The supply source 55 supplies the gas G1 to the vertical nozzle 51.

The gas G1 is not particularly limited and may be a nitrogen gas or a dry air. A temperature of the gas G1 may be room temperature or may be higher than room temperature. In the latter case, the temperature of the gas G1 may be lower than the boiling point of the drying liquid L3.

The inclined nozzle 52 is coupled to a supply source 58 via an opening/closing valve 56 and a flow rate adjustment valve 57. When the opening/closing valve 56 opens a flow path for the gas G2, the gas G2 is discharged from the inclined nozzle 52. On the other hand, when the opening/closing valve 56 closes the flow path for the gas G2, the discharge of the gas G2 from the inclined nozzle 52 is stopped. The flow rate adjustment valve 57 adjusts a flow rate of the gas G2 discharged by the inclined nozzle 52. The supply source 58 supplies the gas G2 to the inclined nozzle 52.

The gas G2 is not particularly limited and may be a nitrogen gas or a dry air. A temperature of the gas G2 may be room temperature or may be higher than room temperature. In the latter case, the temperature of the gas G2 may be lower than the boiling point of the drying liquid L3. In a case where the gas G1 and the gas G2 are the same, the supply source 55 and the supply source 58 may be provided as a unit.

The gas supply unit 50 includes a gas discharge nozzle moving mechanism 60. The gas discharge nozzle moving mechanism 60 moves the vertical nozzle 51 and the inclined nozzle 52 in the horizontal direction. The gas discharge nozzle moving mechanism 60 moves the vertical nozzle 51 and the inclined nozzle 52 between a position immediately above the central portion of the substrate 2 and a position immediately above the outer peripheral portion of the substrate 2. The vertical nozzle 51 and the inclined nozzle 52 may be further moved to a standby position existing more radially outward of the substrate 2 than the outer peripheral portion of the substrate 2.

For example, the gas discharge nozzle moving mechanism 60 includes a swing arm 61 and a swing mechanism 62 for swinging the swing arm 61. The swing arm 61 is disposed in a horizontal posture. The vertical nozzle 51 and the inclined nozzle 52 are held at the distal end of the swing arm 61 with discharge ports 51a and 52a (see FIG. 7) thereof oriented downward. The swing mechanism 62 swings the swing arm 61 about a swing shaft 63 extending downward from the proximal end of the swing arm 61. The liquid discharge nozzle moving mechanism 45 horizontally moves the vertical nozzle 51 and the inclined nozzle 52 by swinging the swing arm 61.

The gas discharge nozzle moving mechanism 60 may include a guide rail and a linear motion mechanism instead of the swing arm 61 and the swing mechanism 62. The guide rail is disposed in a horizontal posture. The linear motion mechanism moves the vertical nozzle 51 and the inclined nozzle 52 along the guide rail. Furthermore, in the present embodiment, the gas discharge nozzle moving mechanism 60 simultaneously moves the vertical nozzle 51 and the inclined nozzle 52 in the same direction at the same speed. However, the vertical nozzle 51 and the inclined nozzle 52 may be moved separately.

The heating unit 70 includes a light source 71 of a laser beam LB for heating a liquid film LF3 of the drying liquid L3. The light source 71 may be disposed outside the rotary shaft portion 14. Since it is not necessary to rotate the light source 71 together with the rotary shaft portion 14, it is possible to reduce a driving force for rotating the rotary shaft portion 14. Furthermore, the light source 71 may be disposed outside a heating head 72 described later. Since it is not necessary to move the light source 71 together with the heating head 72, it is possible to reduce a driving force for moving the heating head 72. The light source 71 may generate the laser beam LB in a pulse-like manner, or may generate the laser beam LB in a continuous manner.

The laser beam LB can apply a large amount of heating energy to the liquid film LF3 and can rapidly heat the liquid film LF3 at a high temperature as compared to a halogen lamp beam, an LED light beam and a heating fluid (for example, hot water or hot gas). Therefore, it is possible to shorten a period of drying time of the liquid film LF3. In addition, since the laser beam LB can heat the liquid film LF3 more rapidly than the halogen lamp beam, the LED light beam and the heating fluid, it is possible to partially heat the liquid film LF3.

The laser beam LB may directly heat the liquid film LF3. However, in the present embodiment, the liquid film LF3 is heated by heating the substrate 2 with the laser beam LB. Unlike the drying liquid L3, the substrate 2 does not have fluidity. Therefore, the heated portion of the substrate 2 is not caused to flow by virtue of the centrifugal force during the rotation of the substrate 2. It is therefore possible to locally heat a specific position of the substrate 2 in the radial direction.

In the laser beam LB, a laser beam having high absorption to the substrate 2 is used. In a case where the substrate 2 is a silicon wafer, a wavelength of the laser beam LB is an infrared wavelength (for example, 800 nm to 1,200 nm).

The heating unit 70 includes the heating head 72 for forming an irradiation point P of the laser beam LB on the substrate 2 held by the substrate holder 10. The heating head 72 may be disposed below the substrate 2 to form the irradiation point P of the laser beam LB on a lower surface 2b of the substrate 2. The lower surface 2b of the substrate 2 is an irradiation surface onto which the laser beam LB is irradiated.

While the heating head 72 is disposed below the substrate 2 in FIGS. 1 and 2, the heating head 72 may be disposed above the substrate 2. In this case, the heating head 72 forms the irradiation point P on the liquid film LF3 of the drying liquid L3. The liquid surface LS3 of the liquid film LF3 is an irradiation surface onto which the laser beam LB is irradiated. The laser beam LB passes through the liquid film LF3 of the drying liquid L3. The laser beam LB is absorbed by the substrate 2 to heat the substrate 2. Heating heads 72 may be disposed at both upper and lower sides of the substrate 2.

The heating head 72 includes an optical system 73 for irradiating the substrate 2 with the laser beam LB. The optical system 73 may include a condensing lens 74 for focusing the laser beam LB toward the substrate 2. The condensing lens 74 may be moved up and down. By moving the condensing lens 74 up and down, it is possible to change the size of the irradiation point P.

The optical system 73 may include a reflection mirror 75 for reflecting the laser beam LB thereat, which propagates along the radial direction of the substrate 2, in a direction perpendicular to the substrate 2. The laser beam LB reflected by the reflection mirror 75 passes through the condensing lens 74 and is irradiated toward the substrate 2. When the heating head 72 moves in the radial direction of the substrate 2, the reflection mirror 75 mounted on the heating head 72 can direct the laser beam LB to the condensing lens 74 regardless of a position of the heating head 72.

The heating head 72 includes a housing 76 that accommodates the optical system 73. The housing 76 protects the optical system 73 from the processing liquid such as the drying liquid L3 or the like that goes around the lower surface 2b of the substrate 2. The housing 76 includes a transmission window for transmitting the laser beam LB therethrough. The transmission window prevents the infiltration of the processing liquid such as the drying liquid L3 or the like.

The heating unit 70 includes a homogenizer 77. The homogenizer 77 is provided in the middle of the optical path of the laser beam LB from the light source 71 to the heating head 72 and is configured to convert a power distribution of the laser beam LB from a Gaussian distribution (see FIG. 3A) to a top hat distribution (see FIG. 3B). The homogenizer 77 may also form an intermediate distribution between the Gaussian distribution and the top hat distribution.

Figure 3A:
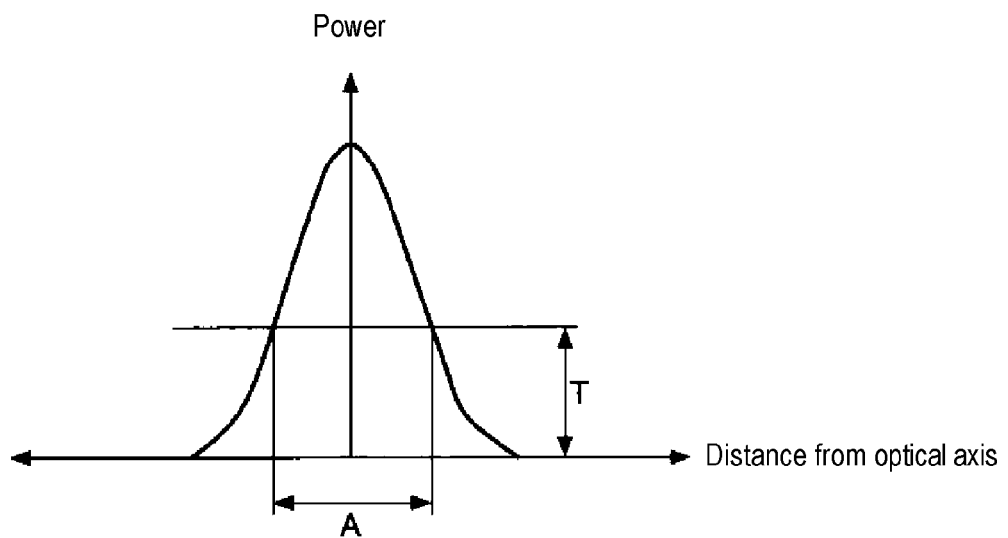
FIGS. 3A and 3B are views showing power distributions of a laser beam according to the first embodiment.
Figure 3B:
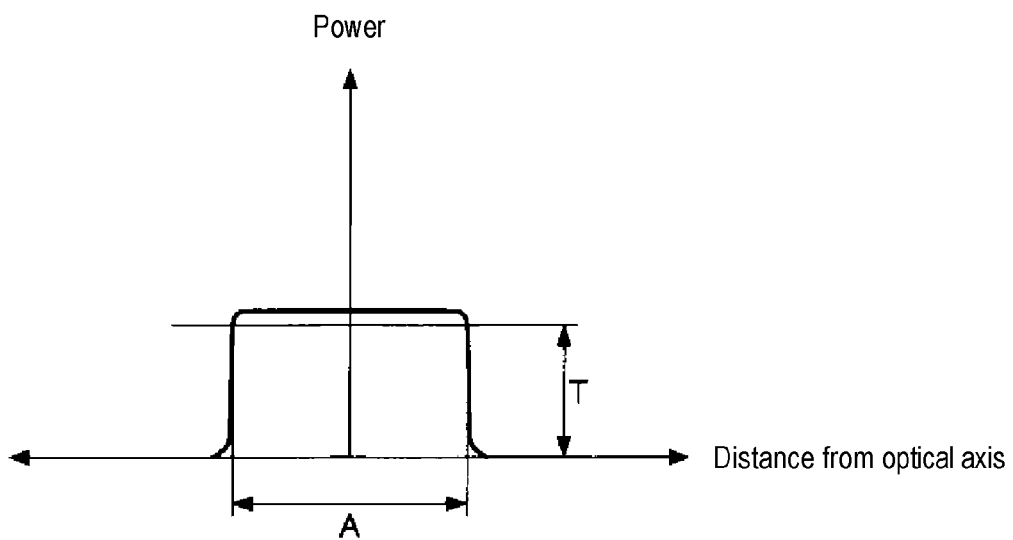

FIGS. 3A and 3B are views showing the power distributions of the laser beam according to the first embodiment. FIG. 3A shows the Gaussian distribution according to the first embodiment. FIG. 3B shows the top hat distribution according to the first embodiment.

The Gaussian distribution is a distribution in which the power (unit: W) decreases as a distance from an optical axis of the laser beam LB increases and in which the power is hardly changed in the circumferential direction of the optical axis. The top hat distribution is a uniform distribution in which the power is hardly changed both in the direction orthogonal to the optical axis and in the circumferential direction of the optical axis.

As is apparent from FIGS. 3A and 3B, in the case of the Gaussian distribution, a range A in which the power is equal to or higher than a threshold T is narrower than that in the case of the top hat distribution. Therefore, as will be described later in detail, by changing the power distribution from the top hat distribution to the Gaussian distribution, it is possible to obtain the same effect as reducing the size of the irradiation point P.

As shown in FIG. 2, the heating unit 70 includes reflection mirrors 78 and 79. The reflection mirror 78 reflects the laser beam LB in a direction parallel to a rotational center line of the substrate 2 and causes the laser beam LB to pass through an internal space of the cylindrical rotary shaft portion 14. The reflection mirror 79 reflects the laser beam LB, which has passed through the internal space of the cylindrical rotary shaft portion 14, in the radial direction of the substrate 2 and guides the laser beam LB to the heating head 72.

The heating unit 70 includes an irradiation point moving mechanism 80. The irradiation point moving mechanism 80 moves the irradiation point P on the irradiation surface (for example, the lower surface 2b of the substrate 2) onto which the laser beam LB is irradiated. As will be described later in detail, the irradiation point P can be moved in the movement direction of the boundary portion 8 while overlapping the irradiation point P with the boundary portion 8 when seen in the vertical direction. The movement direction of the boundary portion 8 is a direction in which the exposed portion 6 is enlarged.

For example, the irradiation point moving mechanism 80 moves the irradiation point P outward from inward of the substrate 2 in the radial direction. When the rotary driver 20 rotates the substrate holder 10, the boundary portion 8 can be moved outward from inward of the substrate 2 in the radial direction so as not to counter a centrifugal force.

The irradiation point moving mechanism 80 includes a heating head moving mechanism 81. The heating head moving mechanism 81 moves the heating head 72 to move the irradiation point P. Since a plurality of places spaced apart in the movement direction of the irradiation point P can be heated by one heating head 72, it is possible to reduce the number of heating heads 72 to be installed. The heating head 72 is disposed in, for example, the gap space 13 formed between the substrate 2 and the plate portion 11 so that the heating head 72 can be moved between a position just below the central portion of the substrate 2 and a position just below the outer peripheral portion of the substrate 2.

The heating head moving mechanism 81 may include a guide rail 82 and a linear motion mechanism 83. The guide rail 82 guides the heating head 72 in the radial direction of the substrate 2. For example, the guide rail 82 is disposed in the gap space 13 formed between the substrate 2 and the plate portion 11 in a horizontal posture. The linear motion mechanism 83 moves the heating head 72 along the guide rail 82. For example, the linear motion mechanism 83 includes a rotary motor and a ball screw that converts a rotary motion of the rotary motor into a linear motion of the heating head 72.

The control part 90 is configured by, for example, a computer, and includes a CPU (Central Processing Unit) 91 and a storage medium 92 such as a memory or the like. The storage medium 92 stores a program for controlling various processes performed in the substrate processing apparatus 1. The control part 90 controls the operation of the substrate processing apparatus 1 by causing the CPU 91 to execute the program stored in the storage medium 92. The control part 90 further includes an input interface (I/F) 93 and an output interface (I/F) 94. The control part 90 receives an external signal through the input interface 93 and transmits a signal to the outside through the output interface 94.

Such a program may be stored in a non-transitory computer-readable storage medium and may be installed from the computer-readable storage medium to the storage medium 92 of the control part 90. Examples of the computer-readable storage medium may include a hard disk (HD), a flexible disk (FD), a compact disk (CD), a magneto-optical desk (MO), a memory card and the like. The program may be downloaded from a server via the Internet and may be installed on the storage medium 92 of the control part 90.

Figure 4:
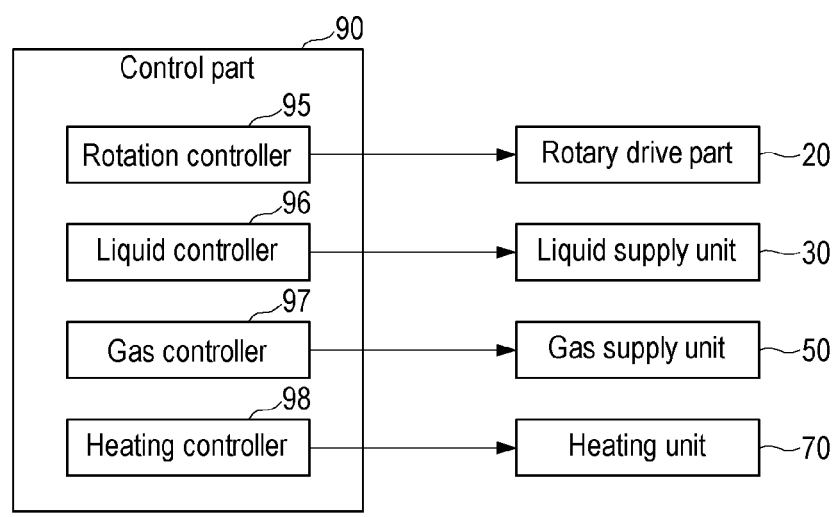
FIG. 4 is a view showing components of a control part according to the first embodiment as functional blocks.

FIG. 4 is a view showing components of the control part according to the first embodiment as functional blocks. The respective functional blocks illustrated in FIG. 4 are conceptual and do not necessarily have to be physically configured as illustrated. All or some of the functional blocks may be functionally or physically distributed and integrated in any unit. All or some of respective processing functions performed in the respective functional blocks may be realized by a program executed in the CPU, or may be realized as hardware by wired logic.

The control part 90 includes a rotation controller 95, a liquid controller 96, a gas controller 97 and a heating controller 98. The rotation controller 95 controls the rotary driver 20. The liquid controller 96 controls the liquid supply unit 30. The gas controller 97 controls the gas supply unit 50. The heating controller 98 controls the heating unit 70. Specific controls will be described later.

Figure 6A:
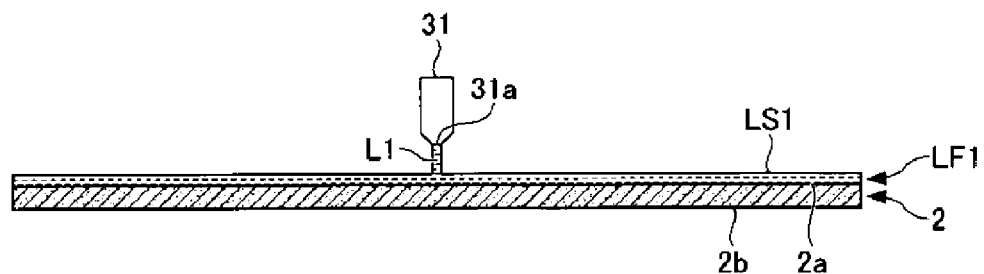
FIGS. 6A to 6D are views showing some steps of a substrate process according to the first embodiment.
Figure 6B:
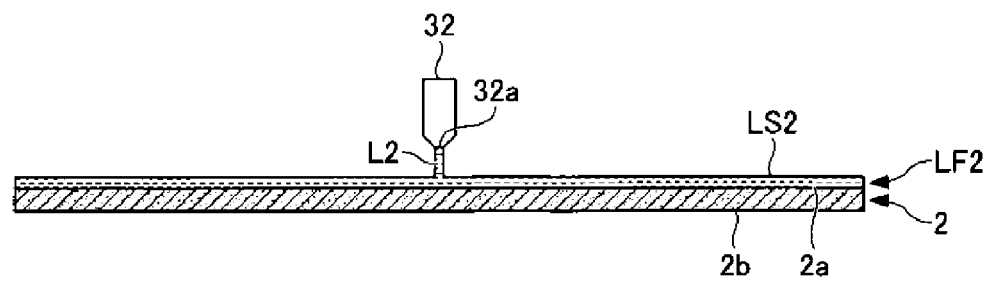
Figure 6C:
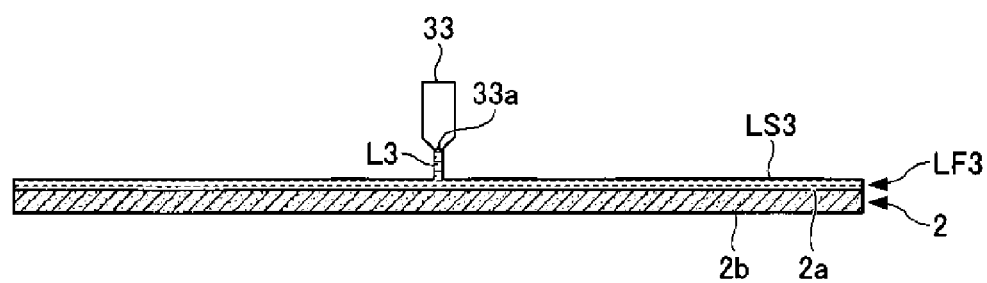
Figure 6D:
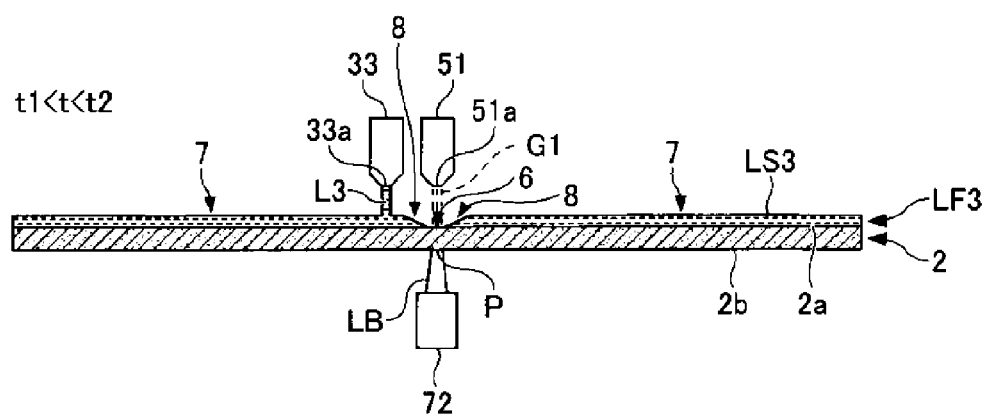
Figure 7A:
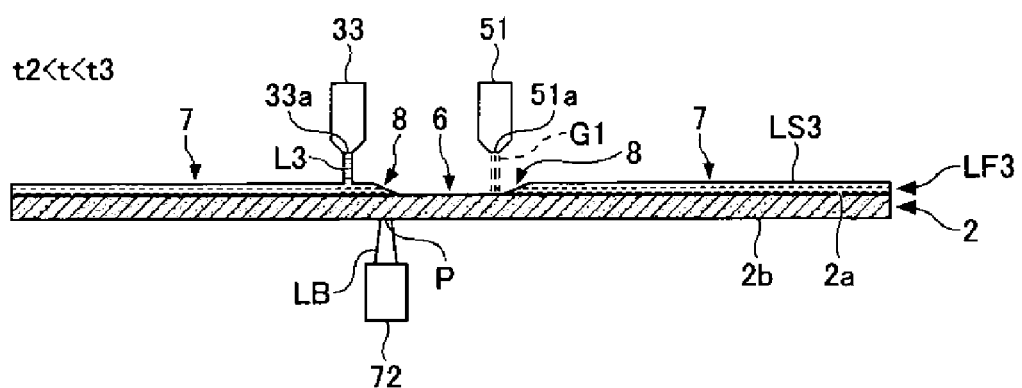
FIGS. 7A to 7D are views showing another steps of the substrate process according to the first embodiment.
Figure 7B:
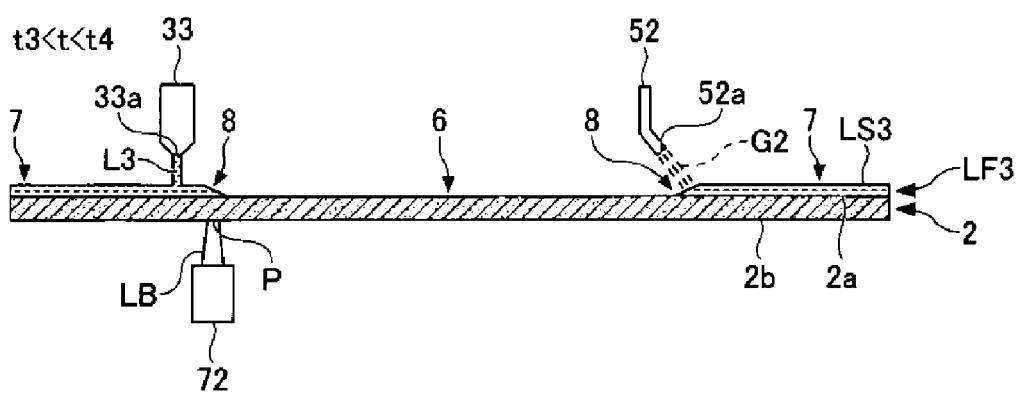
Figure 7C:
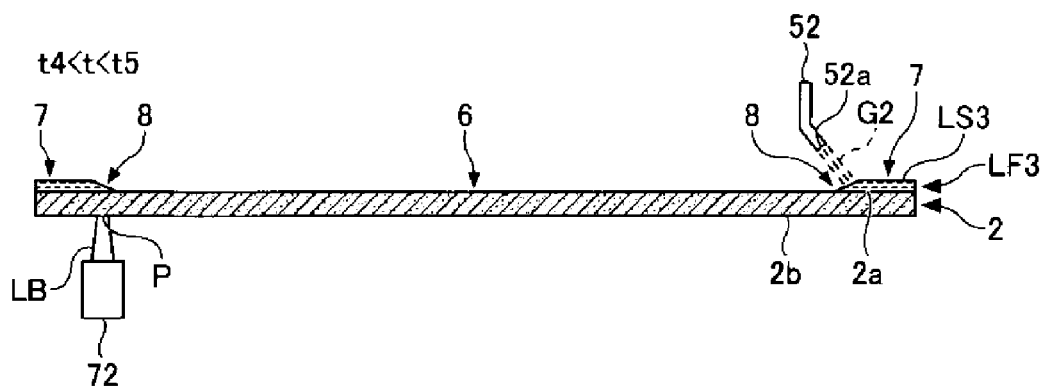
Figure 7D:
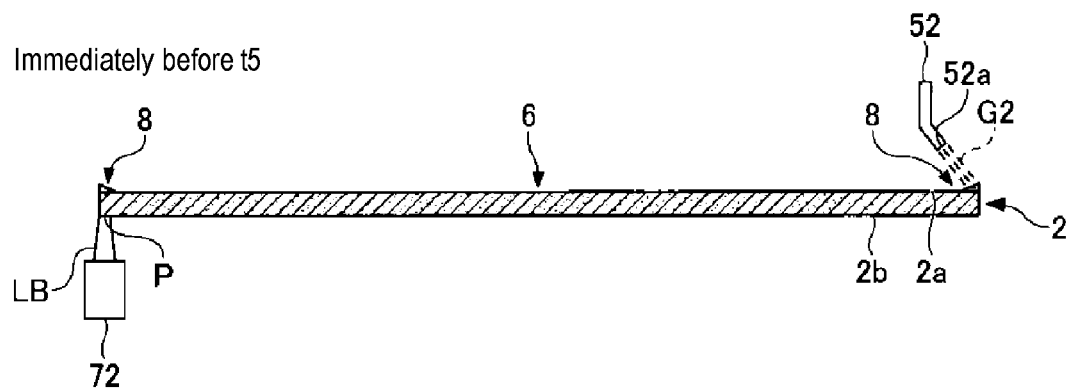
Figure 8:
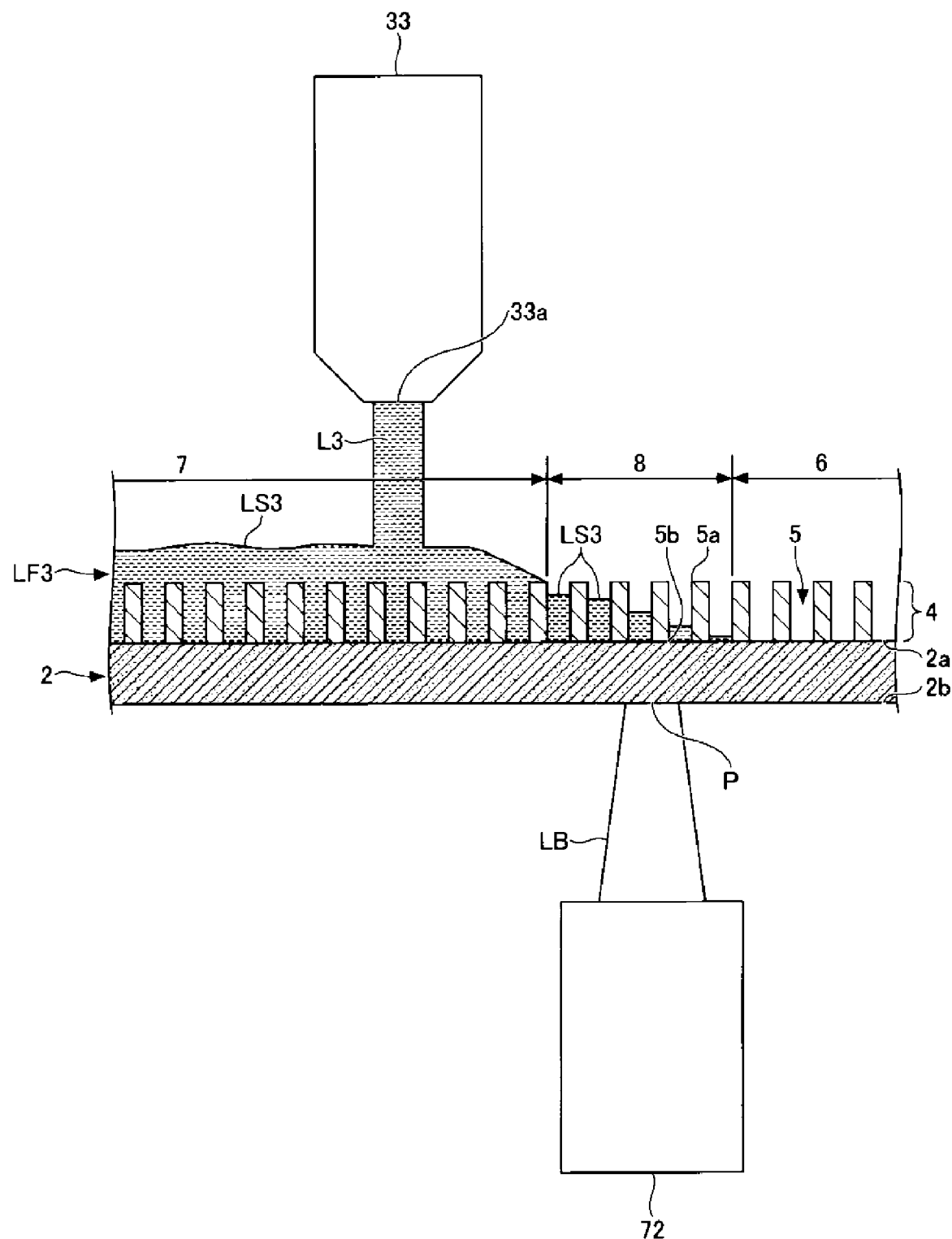
FIG. 8 is a view showing a boundary portion between an exposed portion and a covered portion according to the first embodiment, in which a portion of FIG. 7B is scaled up.
Figure 9:
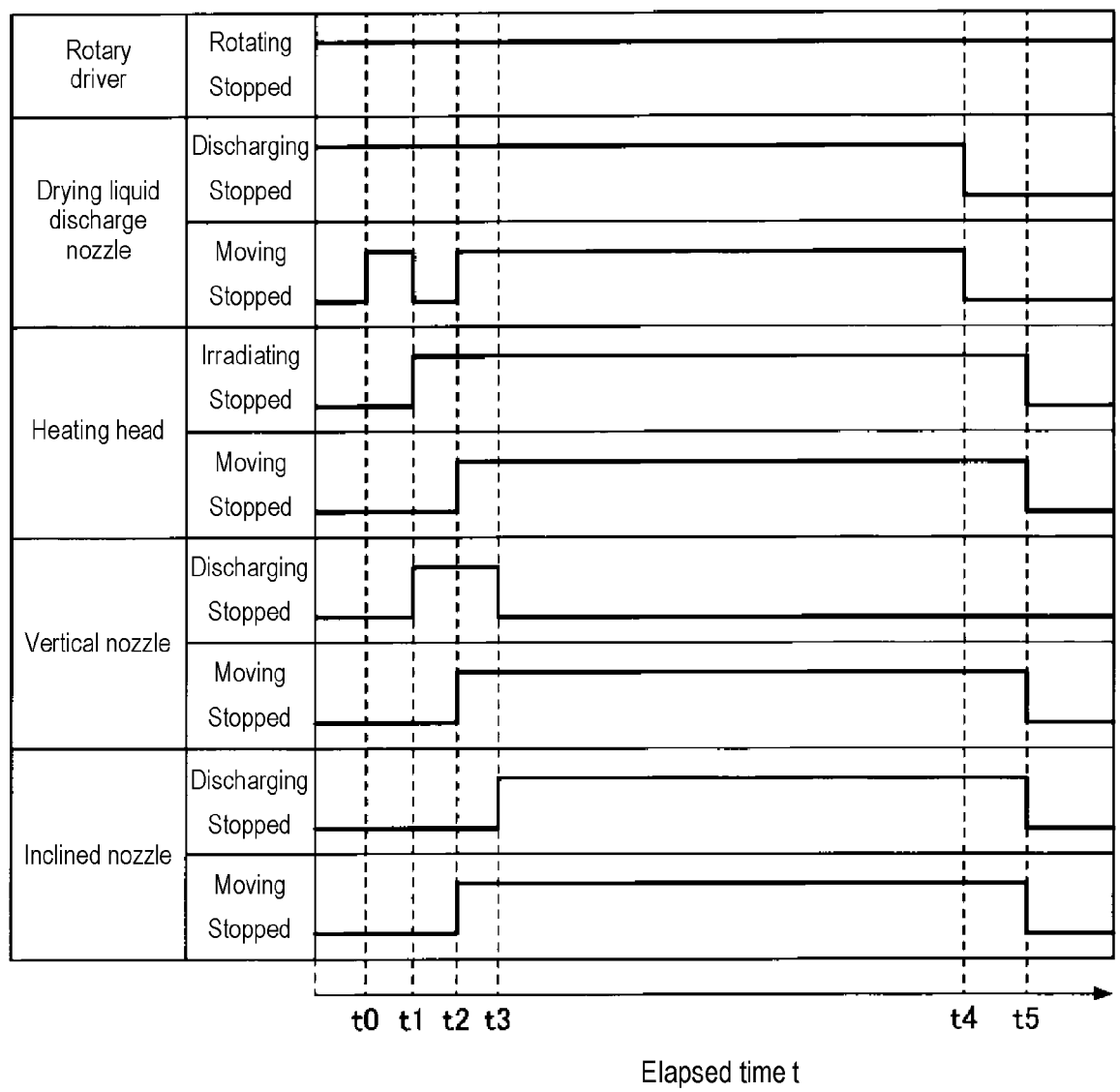
FIG. 9 is a timing chart showing operations of a rotary driver, a drying liquid discharge nozzle, a heating head, a vertical nozzle and an inclined nozzle according to the first embodiment.

FIG. 5 is a flowchart showing a substrate processing method according to the first embodiment. FIGS. 6A to 6D are views showing some steps of a substrate process according to the first embodiment. FIG. 6A is a view showing a state in which the liquid film of the cleaning liquid according to the first embodiment is formed. FIG. 6B is a view showing a state in which the liquid film of the rinsing liquid according to the first embodiment is formed. FIG. 6C is a view showing a state in which the liquid film of the drying liquid according to the first embodiment is formed. FIG. 6D is a view showing a state in which an exposed portion is formed at the central portion of the liquid film of the drying liquid according to the first embodiment. FIGS. 7A to 7D are views showing some of the substrate process according to the first embodiment. FIG. 7A is a view showing a state at the time of starting the expansion of the exposed portion according to the first embodiment. FIG. 7B is a view showing a state during the expansion of the exposed portion according to the first embodiment. FIG. 7C is a view showing a state at the time of completing the discharge of the drying liquid according to the first embodiment. FIG. 7D is a view showing a state immediately before the completion of the expansion of the exposed portion according to the first embodiment. FIG. 8 is a view showing the boundary portion between the exposed portion and the covered portion according to the first embodiment, in which a portion of FIG. 7B is scaled up. FIG. 9 is a timing chart showing the operations of the rotary driver, the drying liquid discharge nozzle, the heating head, the vertical nozzle and the inclined nozzle according to the first embodiment.

The substrate processing method includes step S101 of loading an unprocessed substrate 2 into the substrate processing apparatus 1 (see FIG. 5). The substrate processing apparatus 1 causes the substrate holder 10 to hold the substrate 2 loaded by a transfer device (not shown). The substrate holder 10 holds the substrate 2 in a horizontal posture with the concavo-convex pattern 4 formed on the substrate 2 oriented upward.

The substrate processing method includes step S102 of supplying the cleaning liquid L1 from above onto the substrate 2 held by the substrate holder 10 and forming a liquid film LF1 of the cleaning liquid L1 which covers the concavo-convex pattern 4 (see FIG. 5). In step S102, the cleaning liquid discharge nozzle 31 is disposed directly above the central portion of the substrate 2 (see FIG. 6A). The cleaning liquid discharge nozzle 31 supplies the cleaning liquid L1 from above onto the central portion of the substrate 2 which is rotating together with the substrate holder 10. The supplied cleaning liquid L1 soaks and spreads over the entire upper surface 2a of the substrate 2 by virtue of a centrifugal force, thereby forming the liquid film LF1. In order to clean the entire concavo-convex pattern 4, the number of rotations of the substrate holder 10 and the supply flow rate of the cleaning liquid L1 are set so that the height of the liquid surface LS1 of the cleaning liquid L1 becomes higher than that of the upper end 5a (see FIG. 8) of the concave portion 5.

The substrate processing method includes step S103 of replacing the liquid film LF1 of the cleaning liquid L1 formed in advance with a liquid film LF2 of the rinsing liquid L2 (see FIG. 5). In step S103, instead of the cleaning liquid discharge nozzle 31, the rinsing liquid discharge nozzle 32 is disposed directly above the central portion of the substrate 2 (see FIG. 6B). The discharge of the cleaning liquid L1 from the cleaning liquid discharge nozzle 31 is stopped, and the discharge of the rinsing liquid L2 from the rinsing liquid discharge nozzle 32 is started. The rinsing liquid L2 is supplied onto the central portion of the substrate 2 which is rotating together with the substrate holder 10. The rinsing liquid L2 soaks and spreads over the entire upper surface 2a of the substrate 2 by virtue of the centrifugal force, thereby forming the liquid film LF2. Thus, the cleaning liquid L1 remaining in the concavo-convex pattern 4 is replaced with the rinsing liquid L2. The number of rotations of the substrate holder 10 and the supply flow rate of the rinsing liquid L2 are set so that the heights of the liquid surfaces LS1 and LS2 are maintained higher than that of the upper end 5a (see FIG. 8) of the concave portion 5 during the replacement of the cleaning liquid L1 with the rinsing liquid L2. This makes it possible to suppress the collapse of the pattern due to the surface tension of the liquid surfaces LS1 and LS2.

The substrate processing method includes step S104 of replacing the liquid film LF2 of the rinsing liquid L2 formed in advance with a liquid film LF3 of the drying liquid L3 (see FIG. 5). In step S104, instead of the rinsing liquid discharge nozzle 32, the drying liquid discharge nozzle 33 is disposed directly above the central portion of the substrate 2 (see FIG. 6C). The discharge of the rinsing liquid L2 from the rinsing liquid discharge nozzle 32 is stopped, the discharge of the drying liquid L3 from the drying liquid discharge nozzle 33 is started. The drying liquid L3 is supplied onto the central portion of the substrate 2 which is rotating together with the substrate holder 10. The drying liquid L3 soaks and spreads over the entire upper surface 2a of the substrate 2 by virtue of the centrifugal force, thereby forming the liquid film LF3. Thus, the rinsing liquid L2 remaining in the concavo-convex pattern 4 is replaced with the drying liquid L3. The number of rotations of the substrate holder 10 and the supply flow rate of the drying liquid L3 are set so that the heights of the liquid surfaces LS2 and LS3 are maintained higher than that of the upper end 5a (see FIG. 8) of the concave portion 5 during the replacement of the rinsing liquid L2 with the drying liquid L3. This makes it possible to suppress the collapse of the pattern due to the surface tension of the liquid surfaces LS2 and LS3.

The substrate processing method includes step S105 of forming the exposed portion 6 of the concavo-convex pattern 4 (see FIG. 5). In step S105, in addition to the exposed portion 6, the boundary portion 8 between the exposed portion 6 and the covered portion 7 is also formed. Accordingly, in step S105, the exposed portion 6, the covered portion 7 and the boundary portion 8 are formed. In step S105, first, from time t0 to time t1 shown in FIG. 9, the drying liquid discharge nozzle 33 is slightly moved radially outward from above the central portion of the substrate 2 while discharging the drying liquid L3.

Next, from time t1 to time t2 shown in FIG. 9, instead of the drying liquid discharge nozzle 33, the vertical nozzle 51 is disposed just above the central portion of the substrate 2. The vertical nozzle 51 discharges the gas G1 (see FIG. 6D). The gas G1 is discharged toward the substrate 2 and then spreads evenly and radially along the substrate 2. Therefore, the exposed portion 6 can be formed at the central portion of the substrate 2 in a concentric relationship with the substrate 2.

Furthermore, from time t1 to time t2 shown in FIG. 9, the heating head 72 is disposed directly below the central portion of the substrate 2. The heating head 72 irradiates the central portion of the substrate 2 with the laser beam LB (see FIG. 6D). Since the laser beam LB heats the central portion of the substrate 2, the exposed portion 6 concentric with the substrate 2 can be formed.

In cooperation between the vertical nozzle 51 and the heating head 72, the exposed portion 6 is formed at the central portion of the substrate 2 in a concentric relationship with the substrate 2. Only one of the vertical nozzle 51 and the heating head 72 may be used to form the exposed portion 6.

In FIG. 9, a time at which the vertical nozzle 51 begins to discharge the gas G1 is the same as time t1 at which temporary movement of the drying liquid discharge nozzle 33 is ended. However, the time at which the vertical nozzle 51 begins to discharge the gas G1 may be earlier than time t1, or may be later than time t0 at which the temporary movement of the drying liquid discharge nozzle 33 is started. A space for arranging the vertical nozzle 51 may be provided just above the central portion of the substrate 2.

Furthermore, in FIG. 9, a time at which the heating head 72 starts irradiating the laser beam LB is the same as time t1 at which the temporary movement of the drying liquid discharge nozzle 33 is ended. However, the time at which the heating head 72 begins to irradiate the laser beam LB may be earlier than time t1, or may be the same as or earlier than time t0.

The substrate processing method includes step S106 of expanding the exposed portion 6 by moving the boundary portion 8 (see FIG. 5). In step S106, from time t2 to time t4 shown in FIG. 9, the liquid controller 96 moves the drying liquid discharge nozzle 33 outward from inward of the substrate 2 in the radial direction while discharging the dry liquid L3 from the drying liquid discharge nozzle 33 (see FIGS. 7A and 7B). After being supplied onto the substrate 2, the drying liquid L3 soaks and spreads outward in the radial direction of the substrate 2 by virtue of the centrifugal force and is dropped from the outer peripheral edge of the substrate 2. Since the liquid controller 96 controls the drying liquid discharge nozzle 33 to supply the drying liquid L3 onto the substrate 2 from time t2 to time t4, the outer peripheral portion of the substrate 2 can be coated with the drying liquid L3. Furthermore, since the liquid controller 96 moves the drying liquid discharge nozzle 33 outward from inward of the substrate 2 in the radial direction from time t2 to time t4, the boundary portion 8 can be moved outward from inward of the substrate 2 in the radial direction. The boundary portion 8 is formed more radially inward of the substrate than the discharge port 33a of the drying liquid discharge nozzle 33.

From time t2 to time t3 shown in FIG. 9, the gas controller 97 moves the vertical nozzle 51 outward from inward of the substrate 2 in the radial direction while pressing the boundary portion 8 by discharging the gas G1 from the vertical nozzle 51 (see FIG. 7A). Furthermore, from time t3 to time t4 shown in FIG. 9, the gas controller 97 moves the inclined nozzle 52 outward from inward of the substrate 2 in the radial direction while pressing the boundary portion 8 by discharging the gas G2 from the inclined nozzle 52 in place of the vertical nozzle 51 (see FIG. 7B).

By pressing the boundary portion 8 using the inclined nozzle 52 instead of the vertical nozzle 51, it is possible to efficiently press the boundary portion 8. Since the gas G2 discharged from the inclined nozzle 52 has not only a vertical component but also a horizontal component, the boundary portion 8 can be efficiently pressed.

Although the gas controller 97 simultaneously performs the discharge stop of the gas G1 from the vertical nozzle 51 and the discharge start of the gas G2 from the inclined nozzle 52 at time t3 shown in FIG. 9, the discharge start of the gas G2 from the inclined nozzle 52 may be performed before the discharge stop of the gas G1 from the vertical nozzle 51. By pressing the boundary portion 8 with the gas G1 and the gas G2, it is possible to continuously press the boundary portion 8. The gas controller 97 may start the discharge of the gas G2 from the inclined nozzle 52 after the discharge of the gas G1 from the vertical nozzle 51 is started, namely after the exposed portion 6 is formed in a in a concentric relationship with the substrate 2.

From time t2 to time t4 shown in FIG. 9, the heating controller 98 forms the irradiation point P of the laser beam LB on the substrate 2 and moves the irradiation point P in the movement direction of the boundary portion 8 while overlapping the irradiation point P with the boundary portion 8 when seen in the vertical direction (see FIGS. 7A and 7B). The heating controller 98 may move the irradiation point P by moving the heating head 72.

From time t2 to time t4 shown in FIG. 9, the heating head 72 is moved simultaneously with the drying liquid discharge nozzle 33, the vertical nozzle 51 and the inclined nozzle 52 at the same speed in the movement direction of the boundary portion 8, for example, in the radial direction of the substrate 2.

The heating head 72, the drying liquid discharge nozzle 33, the vertical nozzle 51 and the inclined nozzle 52 may be moved in different directions from the center of the substrate 2, or may be moved in the same direction, as long as they are moved in the radial direction of the substrate 2.

In addition, the heating head 72, the drying liquid discharge nozzle 33, the vertical nozzle 51 and the inclined nozzle 52 may be simultaneously moved at the same speed. The moving speed of the heating head 72, the drying liquid discharge nozzle 33, the vertical nozzle 51 and the inclined nozzle 52 may be changed with time. Details will be described later.

When the drying liquid discharge nozzle 33 reaches a position just above the outer peripheral portion of the substrate 2 immediately before time t4 shown in FIG. 9, the liquid controller 96 stops discharging the drying liquid L3 from the drying liquid discharge nozzle 33 at time t4. Then, from time t4 to time t5, the gas controller 97 moves the inclined nozzle 52 in the movement direction of the boundary portion 8 while pressing the boundary portion 8 by discharging the gas G2 from the inclined nozzle 52 (see FIG. 7C). In addition, from time t4 to time t5, the heating controller 98 forms the irradiation point P of the laser beam LB on the substrate 2 and moves the heating head 72 in the movement direction of the boundary portion 8 while overlapping the irradiation point P with the boundary portion 8 when seen in the vertical direction (see FIG. 7C). Thus, the exposed portion 6 is further expanded.

In addition, from time t3 to time t5 as well as from time t2 to time t3 shown in FIG. 9, the gas controller 97 may move the vertical nozzle 51 in the movement direction of the boundary portion 8 while pressing the boundary portion 8 by discharging the gas G1 from the vertical nozzle 51.

When the heating head 72 reaches a position just below the outer peripheral portion of the substrate 2 immediately before time t5 shown in FIG. 9, the inclined nozzle 52 forms an air flow, which moves outward from inward of the substrate 2 in the radial direction as the air flow goes from above downward, above the outer peripheral portion of the substrate 2 (see FIG. 7D).

At time t5 shown in FIG. 9, the heating controller 98 stops the irradiation of the laser beam LB from the heating head 72, and the gas controller 97 stops the discharge of the gas G2 from the inclined nozzle 52.

The substrate processing method includes step S107 of unloading the processed substrate 2 from the substrate processing apparatus 1 (see FIG. 5). The substrate holder 10 releases the holding of the substrate 2. The transfer device (not shown) receives the substrate 2 from the substrate holder 10 and carries the substrate 2 out of the substrate processing apparatus 1.

As described above, according to the present embodiment, the heating controller 98 moves the irradiation point P in the movement direction of the boundary portion 8 while overlapping the irradiation point P with the boundary portion 8 when seen in the vertical direction. For example, the heating controller 98 moves the heating head 72 in the movement direction of the boundary portion 8 so that the heating head 72 and the boundary portion 8 overlap each other when seen in the vertical direction. As a result, the boundary portion 8 can be intensively heated regardless of the arrival position of the boundary portion 8. The exposed portion 6 and the covered portion 7 are hardly heated by the laser beam LB. The effects will be separately described in the following cases (1) and (2).

(1) When the temperature of the drying liquid L3 discharged by the drying liquid discharge nozzle 33 is set to a temperature higher than room temperature, the following effects are obtained. Since the heating energy can be concentrated on the drying liquid L3 present in the boundary portion 8, it is possible to compensate heat taken away by the vaporization of the drying liquid L3 in the boundary portion 8 and to suppress the drop of the temperature of the drying liquid L3 in the boundary portion 8. Therefore, it is possible to limit the reduction of the surface tension of the drying liquid L3 in the boundary portion 8, thereby suppressing the pattern collapse.

(2) When the temperature of the drying liquid L3 discharged by the drying liquid discharge nozzle 33 is set to room temperature, the following effects are obtained. Since the heating energy can be concentrated on the drying liquid L3 present in the boundary portion 8, it is possible to increase a difference in temperature between the boundary portion 8 and the covered portion 7 (especially, the outer peripheral portion of the substrate 2). In the boundary portion 8, the temperature of the drying liquid L3 can be made higher than room temperature. It is therefore possible to reduce the surface tension of the drying liquid L3 and to suppress the pattern collapse. On the other hand, at the outer peripheral portion of the substrate 2, the temperature of the drying liquid L3 before the boundary portion 8 reaches the outer peripheral portion of the substrate 2 can be maintained at room temperature. It is therefore possible to suppress the vaporization of the drying liquid L3.

At the outer peripheral portion of the substrate 2, as compared with the central portion of the substrate 2, the circumferential velocity of the substrate 2 is high and the centrifugal force is large. Thus, the liquid film LF3 of the drying liquid L3 is thin. For that reason, the suppression of the vaporization of the drying liquid L3 at the outer peripheral portion of the substrate 2 is important in suppressing any unintended exposure of the outer peripheral portion of the substrate 2 from the drying liquid L3 before the boundary portion 8 reaches the outer peripheral portion of the substrate 2. If the outer peripheral portion of the substrate 2 is exposed from the drying liquid L3 before the boundary portion 8 reaches the outer peripheral portion of the substrate 2, particles may adhere to the outer peripheral portion of the substrate 2. The particles are formed by the mist or the like of the drying liquid L3. According to the present embodiment, it is possible to suppress any unintended exposure of the outer peripheral portion of the substrate 2 from the drying liquid L3 before the boundary portion 8 reaches the outer peripheral portion of the substrate 2. This makes it possible to suppress the adhesion of the particles to the outer peripheral portion of the substrate 2. Furthermore, according to the present embodiment, it is possible to suppress any unintended exposure of the outer peripheral portion of the substrate 2 from the drying liquid L3 before the boundary portion 8 reaches the outer peripheral portion of the substrate 2. This makes it possible to suppress the pattern collapse. If the outer peripheral portion of the substrate 2 is unintentionally dried and the drying liquid L3 is sparsely present, the surface tension of the drying liquid L3 may act on the boundary portion 8 to cause the pattern collapse.

As described above, the drying liquid discharge nozzle 33 may discharge the drying liquid L3 at room temperature in order to increase a difference in temperature between the boundary portion 8 and the covered portion 7 (especially, the outer peripheral portion of the substrate 2) for the purpose of suppressing the adhesion of particles. Conventionally, the drying liquid discharge nozzle 33 discharges the drying liquid L3 having a temperature higher than room temperature for the purpose of suppressing the pattern collapse at the time of drying. The higher the temperature of the drying liquid L3, the lower the surface tension of the drying liquid L3 and the lower the stress acting on the concavo-convex pattern 4. On the other hand, there is disclosed a technique of locally heating the boundary portion 8 and discharging the drying liquid L3 at room temperature from the drying liquid discharge nozzle 33 for the purpose of suppressing the pattern collapse and the adhesion of particles.

Furthermore, according to the present embodiment, the heating controller 98 moves the irradiation point P outward from inward of the substrate 2 in the radial direction while allowing the rotation controller 95 to rotate the substrate 2 together with the substrate holder 10. Thus, the boundary portion 8 can be moved outward from inward of the substrate 2 in the radial direction so as not to counter a centrifugal force.

The boundary portion 8 is formed in a ring shape. For that reason, the circumferential length of the boundary portion 8 becomes longer as the boundary portion 8 moves outward from inward of the substrate 2 in the radial direction. Accordingly, as the irradiation point P moves outward from inward of the substrate 2 in the radial direction, the longer boundary portion 8 is heated.

Therefore, while moving the irradiation point P outward from inward of the substrate 2 in the radial direction, the heating controller 98 may execute control to make constant the total irradiation amount per unit area (unit: $J/mm^2$) on the irradiation surface (e.g., the lower surface 2b of the substrate 2). The term "constant" used herein means that the total irradiation amount falls within an allowable range defined by an upper limit value and a lower limit value. Examples of the control may include the following controls (A) to (F). The following controls (A) to (F) may be used either independently or in combination.

(A) The heating controller 98 reduces the speed of movement of the irradiation point P in the radial direction of the substrate 2 as the irradiation point P is moved outward from inward of the substrate 2 in the radial direction. For example, the heating controller 98 reduces the speed of movement of the heating head 72 in the radial direction of the substrate 2 as the heating head 72 is moved outward from inward of the substrate 2 in the radial direction. Thus, the total irradiation amount per unit area can be made uniform throughout the radial direction of the substrate 2, and a change in temperature of the boundary portion 8 caused by a change in circumferential length of the boundary portion 8 can be suppressed.

(B) As the heating controller 98 moves the irradiation point P outward from inward of the substrate 2 in the radial direction, the rotation controller 95 reduces the number of rotations of the substrate holder 10. For example, as the heating controller 98 moves the heating head 72 outward from inward of the substrate 2 in the radial direction, the rotation controller 95 reduces the number of rotations of the substrate holder 10. Thus, the total irradiation amount per unit area can be made uniform throughout the radial direction of the substrate 2, and a change in temperature of the boundary portion 8 caused by a change in circumferential length of the boundary portion 8 can be suppressed.

(C) The heating controller 98 increases the output (unit: W) of the light source 71 as the irradiation point P is moved outward from inward of the substrate 2 in the radial direction. As the output of the light source 71 becomes larger, the power (unit: W) of the laser beam LB at the irradiation point P grows larger. Thus, the total irradiation amount per unit area can be made uniform throughout the radial direction of the substrate 2, and a change in temperature of the boundary portion 8 caused by a change in circumferential length of the boundary portion 8 can be suppressed.

(D) The heating controller 98 increases a duty ratio, which is a ratio (T1/T0) of an irradiation time (T1) of the laser beam LB to a unit time (T0), as the irradiation point P is moved outward from inward of the substrate 2 in the radial direction. The duty ratio is greater than zero and less than or equal to one. When the irradiation point P is moved outward from inward of the substrate 2 in the radial direction, the heating controller 98 gradually increases the duty ratio while repeatedly changing the output of the light source 71 between zero and a set value. As the duty ratio becomes larger, the power (unit: W) of the laser beam LB at the irradiation point P grows larger. Thus, the total irradiation amount per unit area can be made uniform throughout the radial direction of the substrate 2, and a change in temperature of the boundary portion 8 caused by a change in circumferential length of the boundary portion 8 can be suppressed.

(E) The heating controller 98 reduces the size of the irradiation point P as the irradiation point P is moved outward from inward of the substrate 2 in the radial direction. The smaller the size of the irradiation point P, the larger the power per unit area (unit: $W/mm^2$). Thus, the total irradiation amount per unit area can be made uniform throughout the radial direction of the substrate 2, and a change in temperature of the boundary portion 8 caused by a change in circumferential length of the boundary portion 8 can be suppressed.

(F) The heating controller 98 changes the distribution of the power of the laser beam LB at the irradiation point P so that the range A in which the power of the laser beam LB at the irradiation point P is equal to or larger than a threshold value T becomes narrow as the irradiation point P is moved outward from inward of the substrate 2 in the radial direction. The distribution of the power of the laser beam LB is changed, for example, from the top hat distribution to the Gaussian distribution. By changing the distribution of the power of the laser beam LB, the same effect as reducing the size of the irradiation point P can be obtained. Thus, the total irradiation amount per unit area can be made uniform throughout the radial direction of the substrate 2, and a change in temperature of the boundary portion 8 caused by a change in circumferential length of the boundary portion 8 can be suppressed.

According to the present embodiment, the liquid controller 96 controls the drying liquid discharge nozzle 33 to discharge the drying liquid L3, and moves the drying liquid discharge nozzle 33 in the movement direction of the boundary portion 8 while arranging the discharge port 33a of the drying liquid discharge nozzle 33 more radially outward of the substrate 2 than the boundary portion 8. Since the drying liquid L3 is not supplied more radially inward of the substrate 2 than the boundary portion 8, the boundary portion 8 can be prevented from moving in a direction opposite to the direction in which the exposed portion 6 is expanded. Furthermore, since the drying liquid L3 is supplied more radially outward of the substrate 2 than the boundary portion 8, it is possible to suppress any unintended exposure of the outer peripheral portion of the substrate 2 from the drying liquid L3 before the boundary portion 8 reaches the outer peripheral portion of the substrate 2. It is possible to suppress the pattern collapse and the adhesion of particles.

According to the present embodiment, the irradiation point moving mechanism 80 includes the heating head moving mechanism 81 that moves the irradiation point P by moving the heating head 72. Since a plurality of places spaced apart in the movement direction of the irradiation point P can be heated by one heating head 72, it is possible to reduce the number of heating heads 72 to be installed.

Figure 10A:
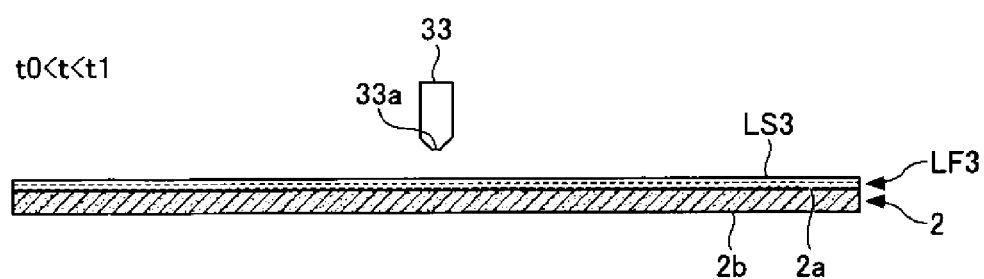
FIGS. 10A to 10D are views showing some steps of a substrate process according to a second embodiment.
Figure 10B:
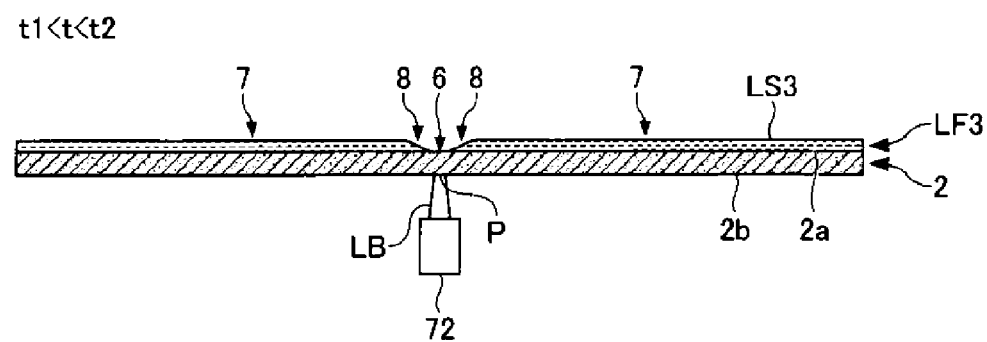
Figure 10C:
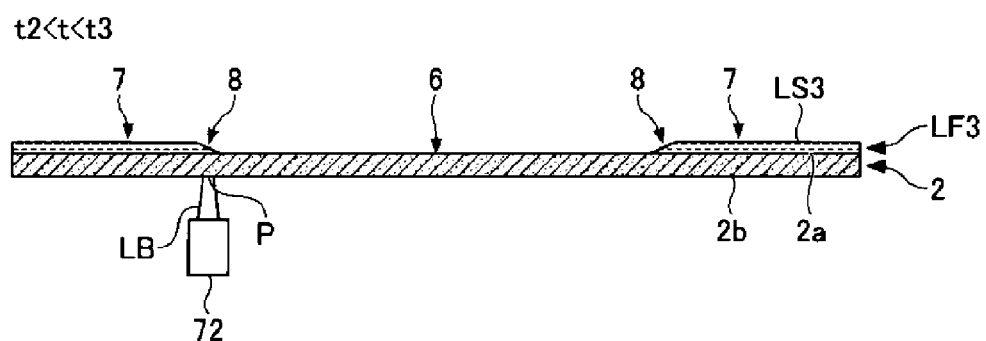
Figure 10D:
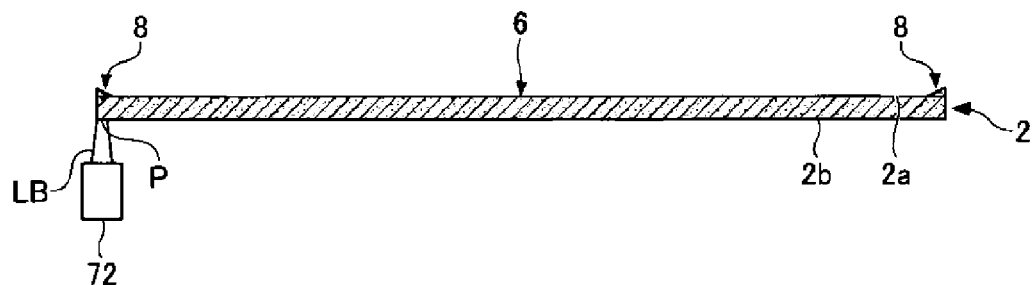
Figure 11:
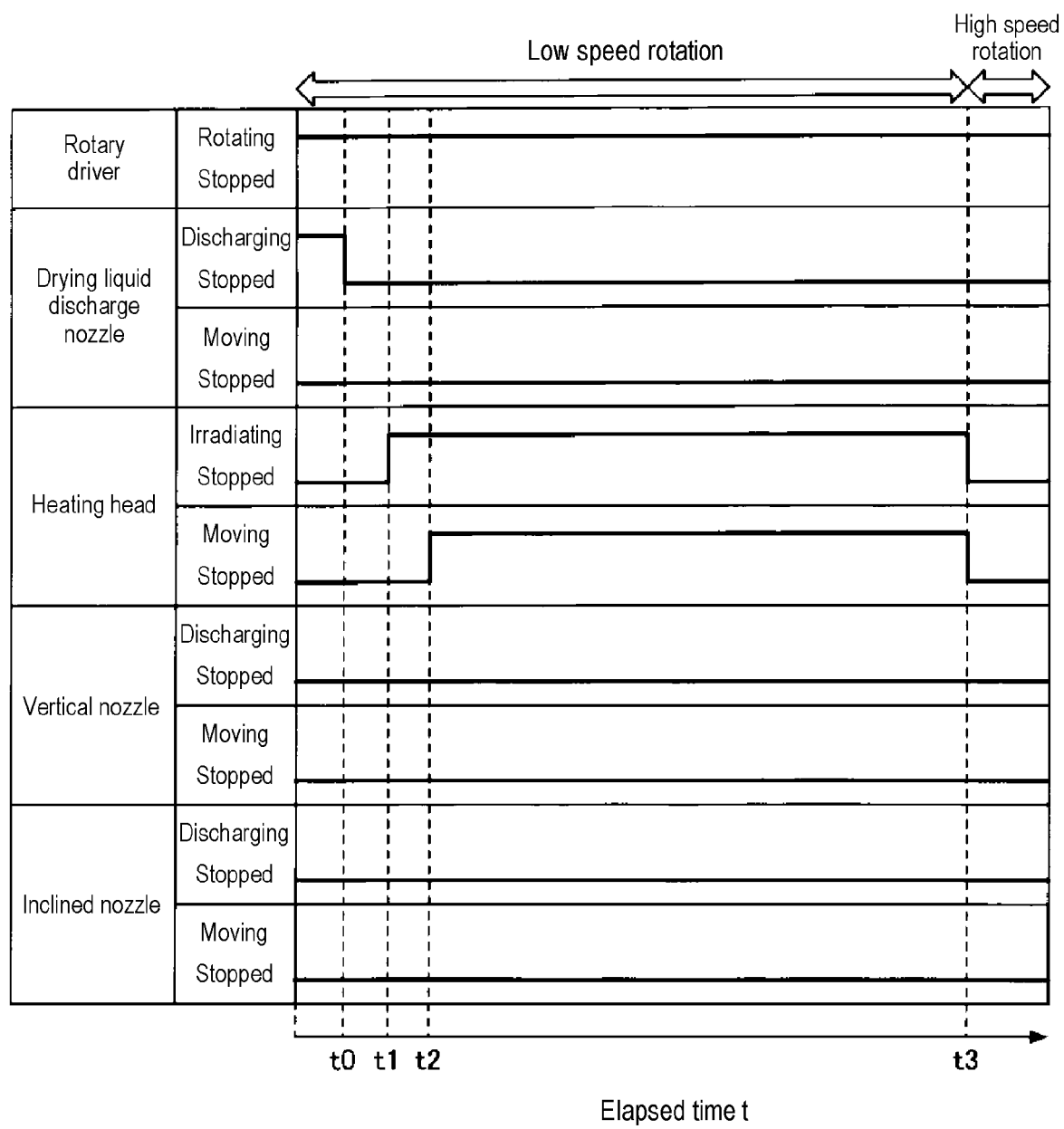
FIG. 11 is a timing chart showing operations of a rotary driver, a drying liquid discharge nozzle, a heating head, a vertical nozzle and an inclined nozzle according to the second embodiment.

FIGS. 10A to 10D are views showing some steps of a substrate process according to a second embodiment. FIG. 10A is a view a state in which the supply of the drying liquid according to the second embodiment is stopped. FIG. 10B is a view showing a state in which the exposed portion is formed at the center of the liquid film of the drying liquid according to the second embodiment. FIG. 10C is a view showing a state during expansion of the exposed portion according to the second embodiment. FIG. 10D is a view showing a state immediately before the completion of the expansion of the exposed portion according to the second embodiment. FIG. 11 is a timing chart showing the operations of the rotary driver, the drying liquid discharge nozzle, the heating head, the vertical nozzle and the inclined nozzle according to the second embodiment. Hereinafter, differences between the second embodiment and the first embodiment will be mainly described.

In step S105 (see FIG. 5) of forming the exposed portion 6 of the concavo-convex pattern 4, first, at time t0 shown in FIG. 11, the liquid controller 96 stops the discharge of the drying liquid L3 from the drying liquid discharge nozzle 33 and stops the supply of the drying liquid L3 to the substrate 2. The drying liquid discharge nozzle 33 discharges the drying liquid L3 at room temperature until just before time t0. A liquid film LF3 of the drying liquid L3 having room temperature is formed at time t0. Even after time t0, the rotation controller 95 rotates the substrate holder 10 so that the liquid film LF3 of the drying liquid L3 having room temperature covers the entire upper surface 2a of the substrate 2 (see FIG. 10A). The number of rotations of the substrate holder 10 is, for example, 200 to 1,000 rpm.

Subsequently, from time t1 to time t2 shown in FIG. 11, the heating head 72 is disposed directly below the central portion of the substrate 2, and the heating head 72 irradiates the central portion of the substrate 2 with the laser beam LB (see FIG. 10B). The central portion of the substrate 2 is heated, and the exposed portion 6 is formed at the central portion of the substrate 2 in a concentric relationship with the substrate 2. At this time, the boundary portion 8 between the exposed portion 6 and the covered portion 7 is pressed radially outward of the substrate 2 by virtue of a centrifugal force so as not to move radially inward of the substrate 2. The number of rotations of the substrate holder 10 is, for example, 200 to 1,000 rpm.

In FIG. 11, time t1 at which the heating of the central portion of the substrate 2 is started is later than time t0 at which the supply of the drying liquid L3 to the substrate 2 is stopped. However, time t1 may be simultaneous with or earlier than time t0.

In step S106 of expanding the exposed portion 6 (see FIG. 5), from time t2 to time t3 shown in FIG. 11, the heating controller 98 moves the heating head 72 (see FIG. 10C). During a period of time between time t2 and time t3, the rotation controller 95 rotates the substrate holder 10.

The heating controller 98 forms the irradiation point P of the laser beam LB on the substrate 2 and moves the heating head 72 in the movement direction of the boundary portion 8 while overlapping the irradiation point P with the boundary portion 8 when seen in the vertical direction (see FIG. 10C). At this time, the boundary portion 8 is pressed radially outward by virtue of the centrifugal force so as not to move radially inward. The number of rotations of the substrate holder 10 is, for example, 200 to 1,000 rpm.

When the heating head 72 reaches just above the outer peripheral portion of the substrate 2 immediately before time t3 shown in FIG. 11, the boundary portion 8 reaches the outer peripheral portion of the substrate 2 (see FIG. 10D). Subsequently, the boundary portion 8 disappears by the vaporization of the drying liquid L3. At time t3, the heating controller 98 stops the irradiation of the laser beam LB from the heating head 72.

Furthermore, at time t3 shown in FIG. 11, the rotation controller 95 increases the number of rotations of the substrate holder 10. The number of rotations of the substrate holder 10 is, for example, 1,000 to 2,000 rpm. Since the number of rotations of the substrate 2 is increased, a large centrifugal force acts on the drying liquid L3 remaining on the outer peripheral portion of the substrate 2. The drying liquid L3 is dropped from the outer peripheral edge of the substrate 2 radially outward of the substrate 2. Thereafter, the substrate 2 is unloaded out of the substrate processing apparatus 1.

A time at which the substrate holder 10 starts high-speed rotation is simultaneous with the time at which the boundary portion 8 reaches the outer peripheral portion of the substrate 2. However, the time at which the substrate holder 10 starts high-speed rotation may be later than the time at which the boundary portion 8 reaches the outer peripheral portion of the substrate 2. Before the boundary portion 8 reaches the outer peripheral portion of the substrate 2, the substrate holder 10 is rotated at a low speed so that the liquid film LF3 of the drying liquid L3 formed on the substrate 2 is not lost by virtue of the centrifugal force.

As described above, according to the present embodiment, just like the first embodiment, the heating controller 98 moves the irradiation point P in the movement direction of the boundary portion 8 while overlapping the irradiation point P with the boundary portion 8 when seen in the vertical direction. For example, the heating controller 98 moves the heating head 72 in the movement direction of the boundary portion 8 so that the heating head 72 and the boundary portion 8 overlap each other when seen in the vertical direction. As a result, the boundary portion 8 can be intensively heated regardless of the arrival position of the boundary portion 8. The exposed portion 6 and the covered portion 7 are hardly heated by the laser beam LB. In the present embodiment, since the liquid film LF3 of the drying liquid L3 having room temperature is formed, the same effects are obtained as in the case of forming the liquid film LF3 of the drying liquid L3 having room temperature in the first embodiment.

That is to say, since the boundary portion 8 can be intensively heated, it is possible to increase a difference in temperature between the boundary portion 8 and the covered portion 7 (especially, the outer peripheral portion of the substrate 2). In the boundary portion 8, the temperature of the drying liquid L3 can be made higher than room temperature. It is therefore possible to reduce the surface tension of the drying liquid L3 and to suppress the pattern collapse. On the other hand, in the outer peripheral portion of the substrate 2, it is possible to suppress any unintended vaporization of the drying liquid L 3 and to suppress any unintended exposure. This makes it possible to suppress the pattern collapse and the adhesion of particles.

According to the present embodiment, just like the first embodiment, the heating controller 98 moves the irradiation point P outward from inward of the substrate 2 in the radial direction while allowing the rotation controller 95 to rotate the substrate 2 together with the substrate holder 10. Thus, the boundary portion 8 can be moved outward from inward of the substrate 2 in the radial direction so as not to counter the centrifugal force.

While moving the irradiation point P outward from inward of the substrate 2 in the radial direction, the heating controller 98 may execute control to make constant the total irradiation amount per unit area (unit: $J/mm^2$) on the irradiation surface (e.g., the lower surface 2b of the substrate 2). Examples of the control may include the above-described controls (A) to (F). The above-described controls (A) to (F) may be used either independently or in combination.

According to the present embodiment, unlike the first embodiment, while the heating controller 98 moves the irradiation point P, the liquid controller 96 stops the discharge of the drying liquid L3 having room temperature from the drying liquid discharge nozzle 33. Since the supply of the drying liquid L3 to the substrate 2 is stopped, there is no need to perform an operation in which the drying liquid discharge nozzle 33 is moved in the movement direction of the boundary portion 8 while arranging the discharge port 33a of the drying liquid discharge nozzle 33 more radially outward of the substrate 2 than the boundary portion 8. It is not necessary to move the drying liquid discharge nozzle 33 and the irradiation point P in conjunction with each other. Thus, the position of the boundary portion 8 can be controlled with high accuracy. This is because the position of the irradiation point P becomes the position of the boundary portion 8. The boundary portion 8 moves so as to overlap the position of the irradiation point P while being pressed radially outward by virtue of the centrifugal force so as not to move radially inward. Furthermore, the discharge of the gases G1 and G2 from the gas supply unit 50 is stopped during the movement of the boundary portion 8 so that the position of the boundary portion 8 can be controlled with higher accuracy (see FIG. 11).

According to the present embodiment, unlike the first embodiment, the supply of the drying liquid L3 to the substrate 2 is stopped during the movement of the boundary portion 8. Thus, the drying liquid L3 is not replenished. For that reason, it is important to suppress the vaporization of the drying liquid L3 in the outer peripheral portion of the substrate 2 before the boundary portion 8 reaches the outer peripheral portion of the substrate 2. From the viewpoint of suppressing the vaporization of the drying liquid L3, the drying liquid L3 having room temperature is used.

According to the present embodiment, just like the first embodiment, the irradiation point moving mechanism 80 includes the heating head moving mechanism 81 that moves the irradiation point P by moving the heating head 72. Since a plurality of places spaced apart in the movement direction of the irradiation point P can be heated by one heating head 72, it is possible to reduce the number of heating heads 72 to be installed.

Figure 12:
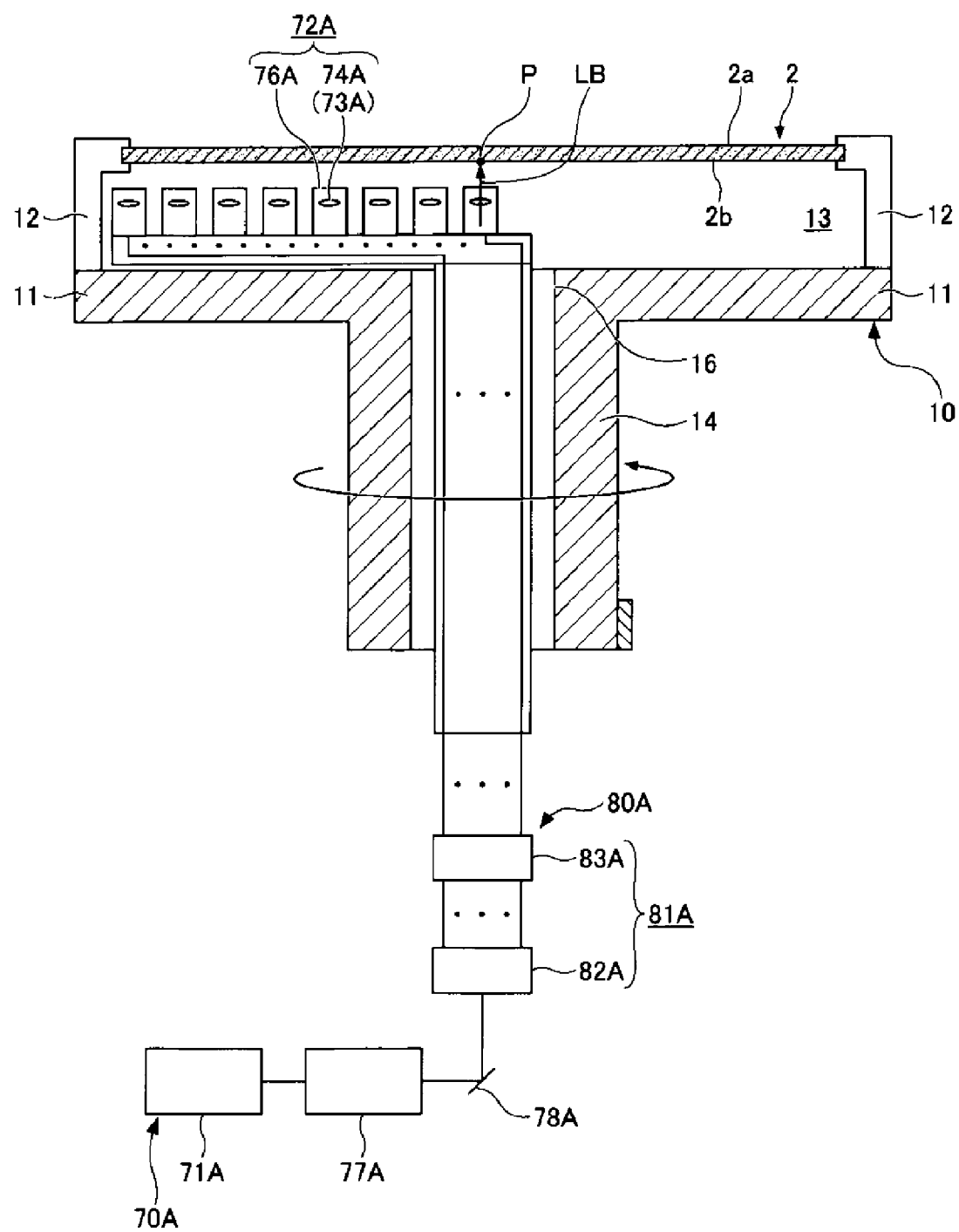
FIG. 12 is a view showing a substrate holder and a heating unit according to a third embodiment.

FIG. 12 is a view showing a substrate holder and a heating unit according to a third embodiment. Differences between the third embodiment and the first and second embodiments will be mainly described below. A heating unit 70A of the third embodiment is used instead of the heating unit 70 of the first and second embodiments.

The heating unit 70A of the third embodiment includes a light source 71A, a plurality of heating heads 72A and an irradiation point moving mechanism 80A. The heating heads 72A heat different positions in the movement direction of the boundary portion 8 (see FIG. 8). The heating heads 72A are arranged, for example, in the radial direction of the substrate 2 to heat the substrate 2 from the central portion of the substrate 2 to the outer peripheral portion of the substrate 2.

Each of the heating heads 72A includes an optical system 73A for irradiating a laser beam LB toward the substrate 2. The optical system 73A includes a condensing lens 74A for focusing the laser beam LB on the substrate 2. Each of the heating heads 72A further includes a housing 76A for accommodating the optical system 73A.

The irradiation point moving mechanism 80A includes a switching mechanism 81A. The switching mechanism 81A moves the irradiation point P by switching each of the heating heads 72A between an operating state and a stopped state. Each of the heating heads 72A locally heats the substrate 2 in the operating state and stops the heating in the stopped state.

According to the third embodiment, since the heating heads 72A do not have to be moved to move the irradiation point P, it is easy to guide the laser beam LB to each of the heating heads 72A. The heating heads 72A are disposed and fixed in the gap space 13 formed between the substrate 2 and the plate portion 11.

For example, the switching mechanism 81A includes a branching part 82A that branches one optical path of the laser beam LB into a plurality of optical paths, and an opening/closing part 83A that independently opens or closes the branched optical paths. The branching part 82A is composed of, for example, a beam splitter. The opening/closing part 83A is composed of, for example, a beam shutter. The laser beam having passed through the opening/closing part 83A is guided to the heating heads 72A by, for example, optical fibers, and is irradiated onto the substrate 2 from the heating heads 72A. A homogenizer 77A and a reflection mirror 78A may be provided between the opening/closing part 83A and the light source 71A.

The heating controller 98 (see FIG. 4) moves the irradiation point P in the movement direction of the boundary portion 8 while overlapping the irradiation point P with the boundary portion 8 when seen in the vertical direction. For example, the heating controller 98 moves the irradiation point P in the movement direction of the boundary portion 8 by sequentially operating the heating heads 72A arranged in the radial direction of the substrate 2. As a result, the boundary portion 8 can be intensively heated regardless of the arrival position of the boundary portion 8. The exposed portion 6 and the covered portion 7 are hardly heated by the laser beam LB. Accordingly, the same effects as those of the first and second embodiments can be obtained.

The heating controller 98 may sequentially operate the heating heads 72A while inhibiting the heating heads 72A from being operated simultaneously. When one of the heating heads 72A is in the operating state, the heating controller 98 may keep other heating heads 72A in the stopped state. This makes it possible to intensively heat the boundary portion 8.

While moving the irradiation point P outward from inward of the substrate 2 in the radial direction, the heating controller 98 may execute control to make constant the total irradiation amount per unit area (unit: $J/mm^2$) on the irradiation surface (e.g., the lower surface 2b of the substrate 2). Examples of the control may include the above-described controls (A) to (F). The above-described control (A) to (F) may be used either independently or in combination.

In the above control (A), for example, the heating controller 98 may increase a switching interval each time when the heating head 72A kept in the operating state is switched from the one located radially inward of the substrate 2 to the one located radially outward of the substrate 2. That is to say, the heating controller 98 may operate the heating head 72A located radially outward of the substrate 2 for a longer time than the heating head 72A located radially inward of the substrate 2.

Figure 13:
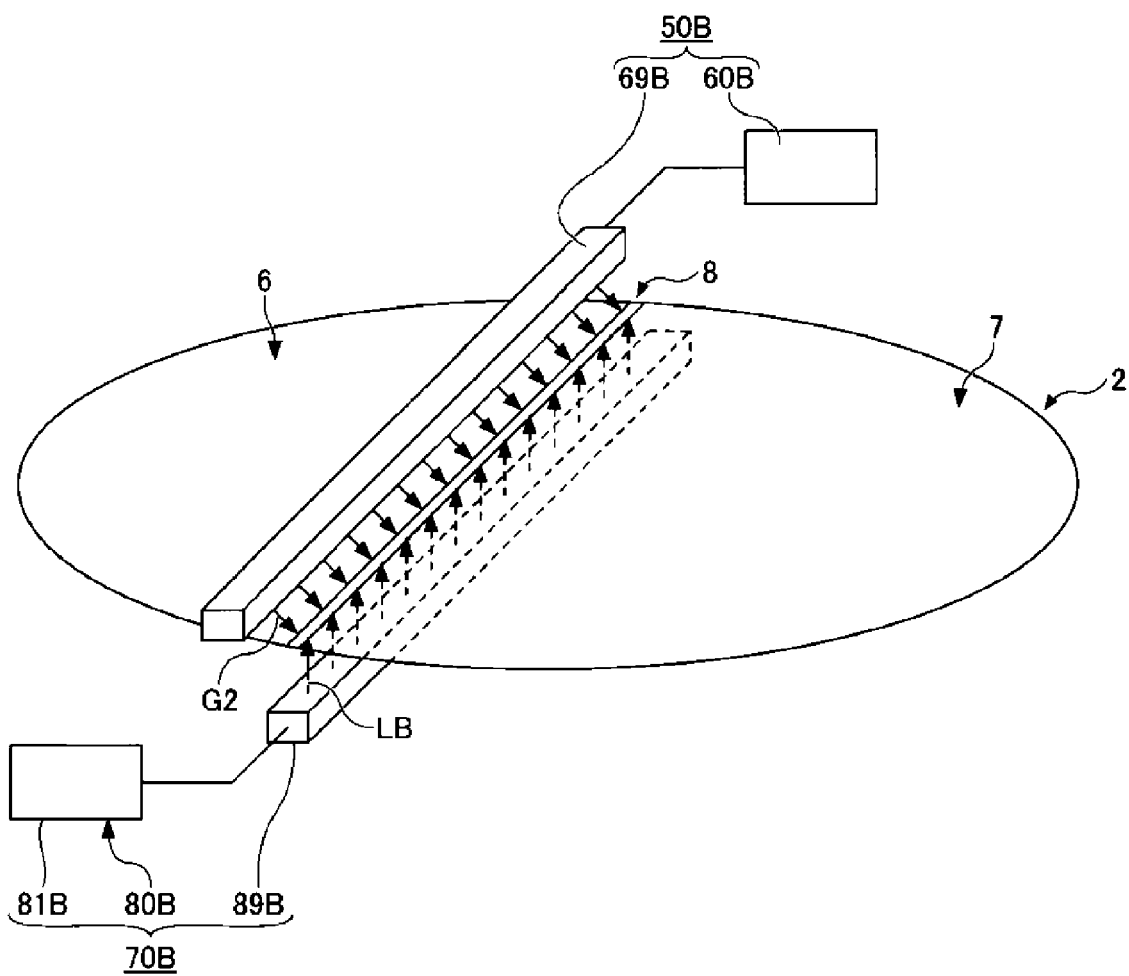
FIG. 13 is a perspective view showing some steps of a substrate process according to a fourth embodiment, which corresponds to FIG. 14B.
Figure 14A:
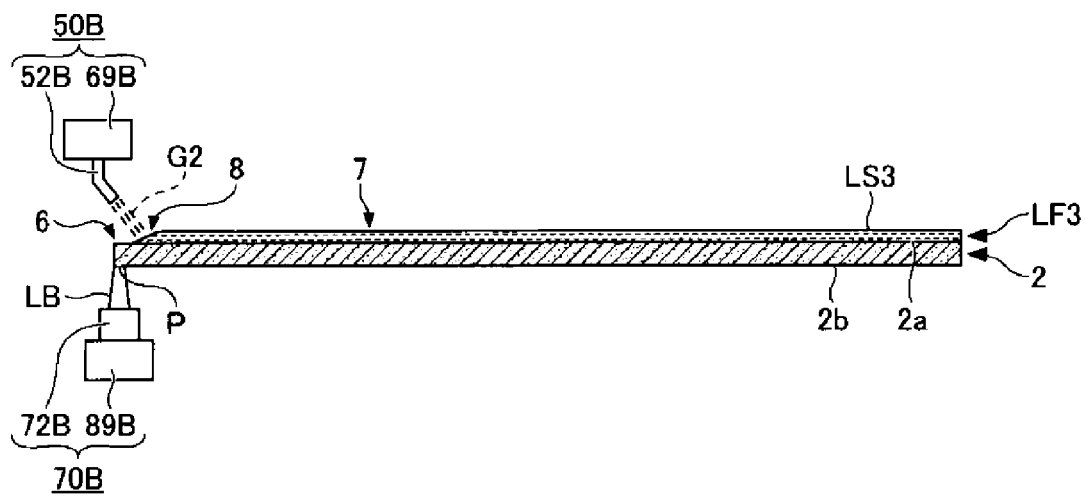
Figure 14B:
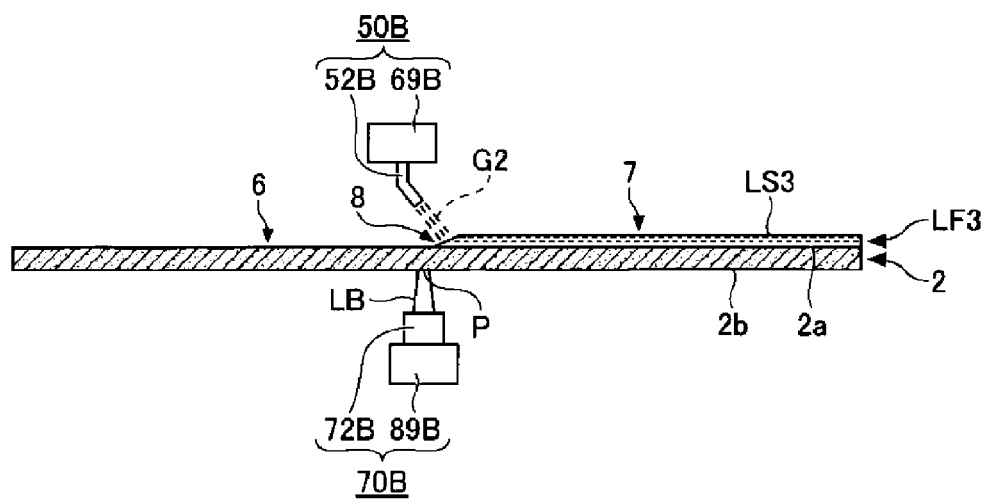

FIG. 13 is a perspective view showing some steps of a substrate process according to a fourth embodiment, which corresponds to FIG. 14B. FIGS. 14A to 14C are side views showing some steps of the substrate process according to the fourth embodiment. FIG. 14A is a view showing a state in which an exposed portion is formed at one end of the liquid film of the drying liquid according to the fourth embodiment. FIG. 14B is a view showing a state during expansion of the exposed portion according to the fourth embodiment. FIG. 14C is a view showing a state immediately before the completion of the expansion of the exposed portion according to the fourth embodiment. Differences between the fourth embodiment and the first to third embodiments will be mainly described below.

In step S105 (see FIG. 5) of forming the exposed portion 6 of the concavo-convex pattern 4 and step S106 (see FIG. 5) of expanding the exposed portion 6, the substrate 2 is kept stationary without being rotated. For that reason, the centrifugal force cannot be used to press the boundary portion 8. Therefore, the pressure of the gas G2 supplied from the gas supply unit 50B is used to press the boundary portion 8.

The gas supply unit 50B may include a vertical nozzle as a gas discharge nozzle for discharging a gas. However, in the present embodiment, the gas supply unit 50B includes a plurality of inclined nozzles 52B. Each of the inclined nozzles 52B discharges a gas G2 obliquely with respect to the vertical direction. Since the gas G2 has not only a vertical component but also a horizontal component, it is possible to efficiently press the boundary portion 8.

The gas supply unit 50B includes a linear bar 69B arranged in a horizontal posture. The bar 69B is used for fixing the plurality of inclined nozzles 52B. The inclined nozzles 52B are arranged in the longitudinal direction of the bar 69B. The inclined nozzles 52B simultaneously discharge the gas G2 having a horizontal component acting in the same direction as the movement direction of the boundary portion 8 (for example, the right direction in FIG. 14). Ae gas flow of the gas G2 simultaneously formed by the inclined nozzles 52B is formed over a range substantially equal to or larger than the diameter of the substrate 2.

The gas supply unit 50B includes a gas discharge nozzle moving mechanism 60B. The gas discharge nozzle moving mechanism 60B moves the bar 69B in the width direction orthogonal to the longitudinal direction of the bar 69B, thereby moving the inclined nozzles 52B in the movement direction of the boundary portion 8. During the movement of the boundary portion 8, the boundary portion 8 can be pressed by the pressure of the gas G2.

The heating unit 70B includes a linear bar 89B disposed in a horizontal posture. The bar 89B of the heating unit 70B and the bar 69B of the gas supply unit 50B are disposed in parallel to each other. The bar 89B of the heating unit 70B is a bar to which a plurality of heating heads 72B is fixed. The heating heads 72B are arranged in the longitudinal direction of the bar 89B. A plurality of irradiation points P simultaneously formed by the heating heads 72B is formed over a range substantially equal to or larger than the diameter of the substrate 2.

The heating unit 70B includes an irradiation point moving mechanism 80B that moves the irradiation points P. The irradiation point moving mechanism 80B includes a heating head moving mechanism 81B that moves the bar 89B in the width direction orthogonal to the longitudinal direction of the bar 89B and moves the heating heads 72B in the movement direction of the boundary portion 8. The irradiation points P simultaneously formed by the heating heads 72B are continuously formed so as to cross the substrate 2 and are moved so as to overlap the boundary portion 8 when seen in the vertical direction.

In step S105 (see FIG. 5) of forming the exposed portion 6 of the concavo-convex pattern 4, the heating controller 98

(see FIG. 4) irradiates one end of the substrate 2 with the laser beam LB, and the gas supply unit 50B blows the gas G2 toward one end of the substrate 2 (see FIG. 14A). Thus, the exposed portion 6 is formed at one end of the substrate 2.

In step S106 of expanding the exposed portion 6 (see FIG. 5), the heating controller 98 moves the bar 89B to move the heating heads 72B, and the gas controller 97 (see FIG. 4) moves the bar 69B to move the inclined nozzles 52B (see FIGS. 14B and 14C).

The heating controller 98 forms the irradiation point P of the laser beam LB on the substrate 2 and moves the heating heads 72B in the movement direction of the boundary portion 8 while overlapping the irradiation point P with the boundary portion 8 when seen in the vertical direction. Furthermore, the gas controller 97 moves the inclined nozzles 52B in the movement direction of the boundary portion 8 while pressing the boundary portion 8 with the gas G2.

Although the irradiation point moving mechanism 80B of the fourth embodiment includes the heating head moving mechanism 81B, the irradiation point moving mechanism 80B may include a switching mechanism as in the third embodiment. The switching mechanism moves the irradiation point P in the movement direction of the boundary portion 8 by switching each of the heating heads 72B arranged along the movement direction of the boundary portion 8 between an operating state and a stopped state. In this case, the heating heads 72B are arranged not only along the movement direction of the boundary portion 8 but also along the direction orthogonal to the movement direction of the boundary portion 8 in order to heat the entire substrate 2.

Although the embodiments of the substrate processing apparatus and the substrate processing method according to the present disclosure have been described above, the present disclosure is not limited to the above-described embodiments. Various changes, modifications, substitutions, additions, deletions and combinations may be made within the scope of the claims. Of course, such changes, modifications, substitutions, additions, deletions and combinations belong to the technical scope of the present disclosure.

The heating controller 98 of the above-described embodiments executes control to make constant the total irradiation amount per unit area on the irradiation surface while moving the irradiation point P outward from inward of the substrate 2 in the radial direction. However, the technique of the present disclosure is not limited thereto. For example, while moving the irradiation point P outward from inward of the substrate 2 in the radial direction, the heating controller 98 may execute control to gradually increase the total irradiation amount per unit area on the irradiation surface. Along with the lapse of time, the amount of heat exceeds an amount necessary to expose the entire concave portion 5 in the depth direction from the processing liquid. However, the excess of the amount of heat does not matter from the viewpoint of suppressing the pattern collapse.

The heating controller 98 of the above-described embodiments moves the heating heads 72B in the movement direction of the boundary portion 8 while overlapping the irradiation point P of the laser beam LB with the boundary portion 8 when seen in the vertical direction. However, the technique of the present disclosure is not limited thereto. The laser beam LB can apply a large amount of heating energy to the liquid film LF3 and can rapidly heat the liquid film LF3 to a high temperature as compared with a halogen lamp beam, an LED light beam and a heating fluid (e.g., hot water or high temperature gas). This makes it possible to shorten the drying time of the liquid film LF3. Accordingly, it is also possible to form the exposed portion 6 by forming the irradiation point P directly on the covered portion 7. That is, when seen in the vertical direction, the irradiation point P may not overlap the boundary portion 8 and may be separated from the boundary portion 8.

The heating controller 98 of the above-described embodiments expands the exposed portion 6 of the concavo-convex pattern 4 exposed from the processing liquid by moving the position of the irradiation point P in the substrate 2 or the liquid film LF3. However, the technique of the present disclosure is not limited thereto. For example, the heating controller 98 may simultaneously form the exposed portion 6 on the entire substrate 2 by simultaneously irradiating the entire substrate 2 or the entire liquid film LF3 with the laser beam LB. Since the laser beam LB can apply a large amount of heating energy to the liquid film LF3 and can rapidly heat the liquid film LF3 to a high temperature as compared with a halogen lamp beam, an LED light beam and a heating fluid (e.g., hot water or high temperature gas), it is possible to shorten the drying time of the liquid film LF3. Accordingly, it is possible to shorten a period of time during which the surface tension of the liquid film LF3 acts on the concavo-convex pattern 4, thereby suppressing the pattern collapse.

Although the technique of the present disclosure is applied to the drying of the liquid film LF3 of the drying liquid L3 in the above-described embodiments, the technique of the present disclosure is also applicable to the drying of the liquid film LF2 of the rinsing liquid L2. In the latter case, an exposed portion is formed on the liquid film LF2 of the rinsing liquid L2, and the exposed portion is expanded. When the cleaning of the substrate 2 is finished without replacing the liquid film LF2 of the rinsing liquid L2 with the liquid film LF3 of the dry liquid L3, the technique of the present disclosure is applied to the drying of the liquid film LF2 of the rinsing liquid L2.

According to the present disclosure in some embodiments, it is possible to suppress collapse of a concavo-convex pattern when drying a liquid film which covers the concavo-convex pattern.

What is claimed is:
1. A substrate processing apparatus, comprising:
 a substrate holder configured to hold a substrate with a surface of the substrate on which a concavo-convex pattern is formed oriented upward;
 a liquid supply nozzle configured to supply a processing liquid to the substrate held by the substrate holder to form a liquid film at least in a concave portion of the concavo-convex pattern;
 a heating unit including a light source configured to generate a laser beam, at least one heating head configured to form an irradiation point of the laser beam on the substrate held by the substrate holder or the liquid film, and an irradiation point moving mechanism configured to move the irradiation point by moving the at least one heating head; and
 a heating controller configured to control the heating unit,
 wherein the heating controller is configured to control the heating unit to irradiate the laser beam onto the substrate or the liquid film for drying the liquid film to expose the entire concave portion in a depth direction from the processing liquid, and to control the irradiation point moving mechanism to move a position of the at least one heating head outward from inward of the substrate in a radial direction of the substrate with an increasing output of the light source as the at least one heating head is moving in the radial direction.

2. The apparatus of claim 1, wherein the heating controller controls the heating unit to expand the exposed portion of the concavo-convex pattern exposed from the processing liquid.

3. The apparatus of claim 2, further comprising:
a rotary driver configured to rotate the substrate holder; and
a rotation controller configured to control the rotary driver,
wherein the rotation controller controls the rotary driver to rotate the substrate together with the substrate holder.

4. The apparatus of claim 3, wherein the heating controller increases a duty ratio, which is a ratio of an irradiation time of the laser beam to a unit time, as the irradiation point is moved outward from inward of the substrate in the radial direction.

5. The apparatus of claim 3, wherein the heating controller reduces a size of the irradiation point as the irradiation point is moved outward from inward of the substrate in the radial direction.

6. The apparatus of claim 3, wherein the heating controller changes a power distribution of the laser beam at the irradiation point so that a range in which a power of the laser beam at the irradiation point is equal to or larger than a threshold value becomes narrow as the irradiation point is moved outward from inward of the substrate in the radial direction.

7. The apparatus of claim 1, wherein the liquid supply nozzle comprises a liquid discharge nozzle configured to discharge the processing liquid and a liquid discharge nozzle moving mechanism configured to move the liquid discharge nozzle,
the apparatus further comprises a liquid controller configured to control the liquid supply nozzle, and
the liquid controller controls the liquid supply nozzle to discharge the processing liquid from the liquid discharge nozzle and controls the liquid discharge nozzle moving mechanism to move the liquid discharge nozzle outward from inward of the substrate in a radial direction.

8. The apparatus of claim 1, wherein the liquid supply nozzle includes a liquid discharge nozzle configured to discharge the processing liquid having room temperature onto the substrate.

9. A substrate processing method, comprising:
forming a liquid film at least in a concave portion of a concavo-convex pattern while holding a substrate in a state where a front surface of the substrate on which the concavo-convex pattern is formed is oriented upward and supplying a processing liquid onto the substrate from above;
forming an exposed portion in which the entire concave portion in a depth direction is exposed from the processing liquid, wherein the forming the exposed portion includes exposing the entire concave portion in the depth direction from the processing liquid by irradiating the substrate or the liquid film with a laser beam for drying the liquid film, and forming an irradiation point of the laser beam on the substrate or the liquid film by controlling at least one heating head; and
expanding the exposed portion by moving a position of the irradiation point on the substrate or the liquid film, wherein the expanding the exposed portion includes moving a position of the at least one heating head outward from inward of the substrate in a radial direction of the substrate with an increasing power of the light source as the at least one heating head is moving in the radial direction.

* * * * *